(12) United States Patent
Ando

(10) Patent No.: US 12,416,937 B2
(45) Date of Patent: Sep. 16, 2025

(54) SEMICONDUCTOR DEVICE

(71) Applicants: KABUSHIKI KAISHA TOSHIBA, Tokyo (JP); Toshiba Electronic Devices & Storage Corporation, Tokyo (JP)

(72) Inventor: Tomohiro Ando, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 55 days.

(21) Appl. No.: 18/423,373

(22) Filed: Jan. 26, 2024

(65) Prior Publication Data

US 2025/0103080 A1 Mar. 27, 2025

(30) Foreign Application Priority Data

Sep. 25, 2023 (JP) ................................ 2023-160083

(51) Int. Cl.
*G05F 3/26* (2006.01)
*G01R 19/00* (2006.01)
*H03F 3/45* (2006.01)

(52) U.S. Cl.
CPC ......... *G05F 3/262* (2013.01); *G01R 19/0092* (2013.01); *H03F 3/45179* (2013.01); *H03F 2200/462* (2013.01); *H03F 2200/474* (2013.01)

(58) Field of Classification Search
None
See application file for complete search history.

(56) References Cited

U.S. PATENT DOCUMENTS

| 6,198,315 | B1 * | 3/2001 | Nakano ..................... H02P 7/04 327/423 |
| 10,115,251 | B2 | 10/2018 | Soma et al. |
| 11,378,598 | B2 * | 7/2022 | Ando ................. H03F 3/45475 |
| 11,448,668 | B2 | 9/2022 | Taguchi et al. |
| 12,092,666 | B1 * | 9/2024 | Li ........................ H10D 30/669 |

FOREIGN PATENT DOCUMENTS

| JP | 2007-166861 A | 6/2007 |
| JP | 6487280 B2 | 3/2019 |
| JP | 2021-139665 A | 9/2021 |

\* cited by examiner

*Primary Examiner* — Jeffrey S Zweizig
(74) *Attorney, Agent, or Firm* — Finnegan, Henderson, Farabow, Garrett & Dunner, LLP

(57) ABSTRACT

According to one embodiment, a semiconductor device includes: a first circuit configured to drive a load couplable to a first terminal by supplying a load current to the load; and a third circuit including a second circuit configured to copy the load current based on a first voltage of the first terminal and output a first current obtained by copying the load current, the third circuit being configured to monitor a second current based on the first current. The third circuit further includes a fourth circuit configured to adjust the second current in a case where the load current is not supplied to the load.

15 Claims, 16 Drawing Sheets

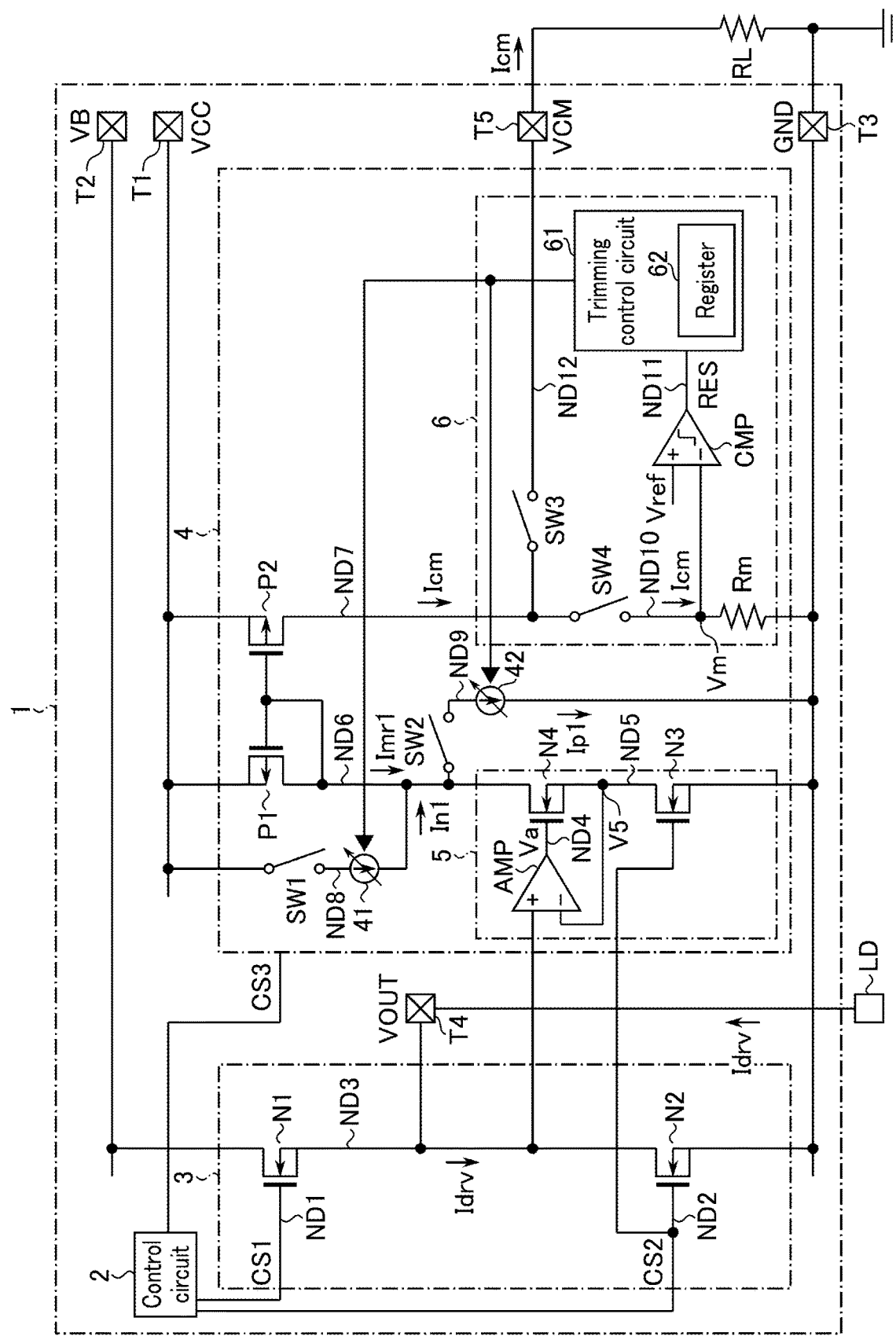
F I G. 1

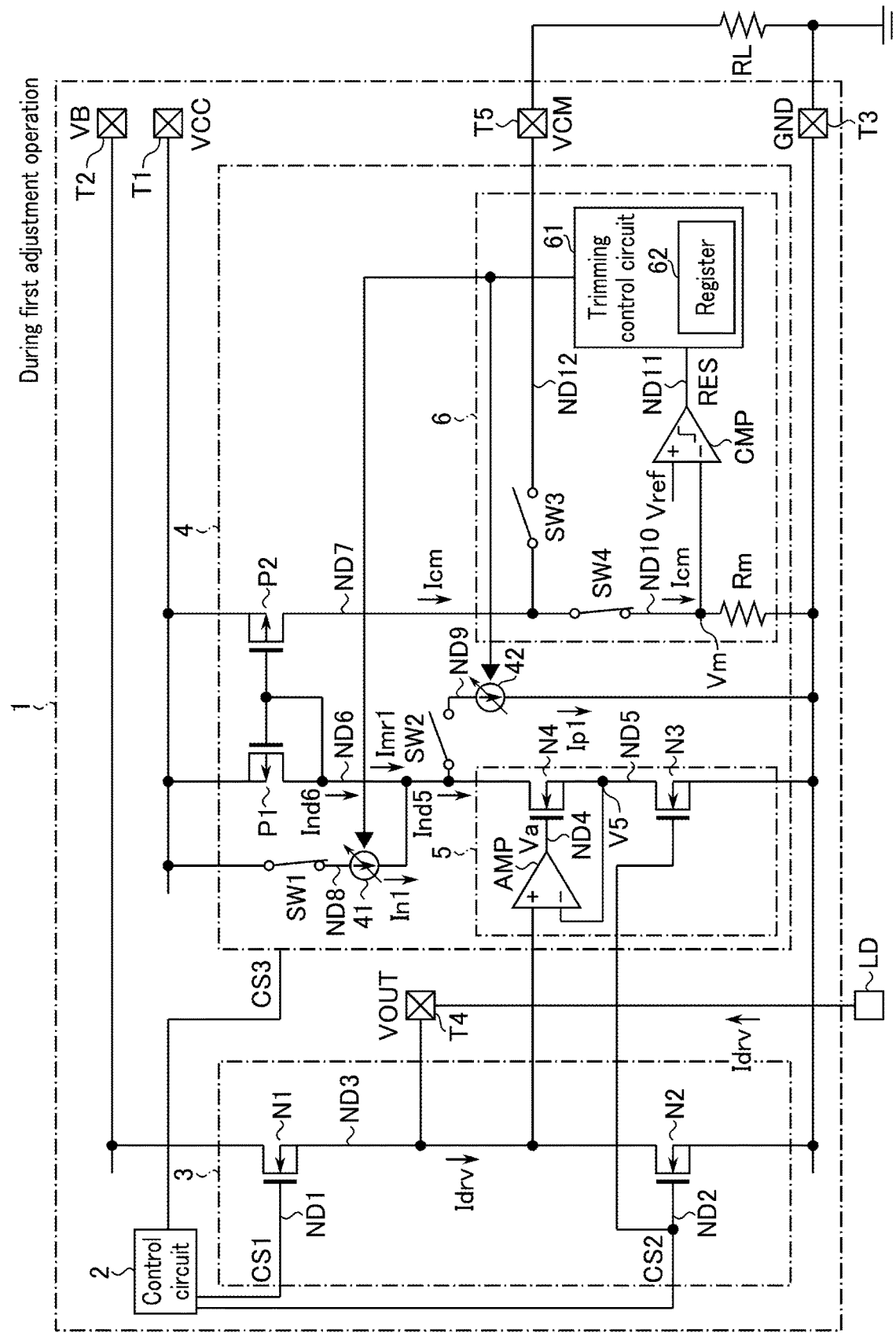
F I G. 5

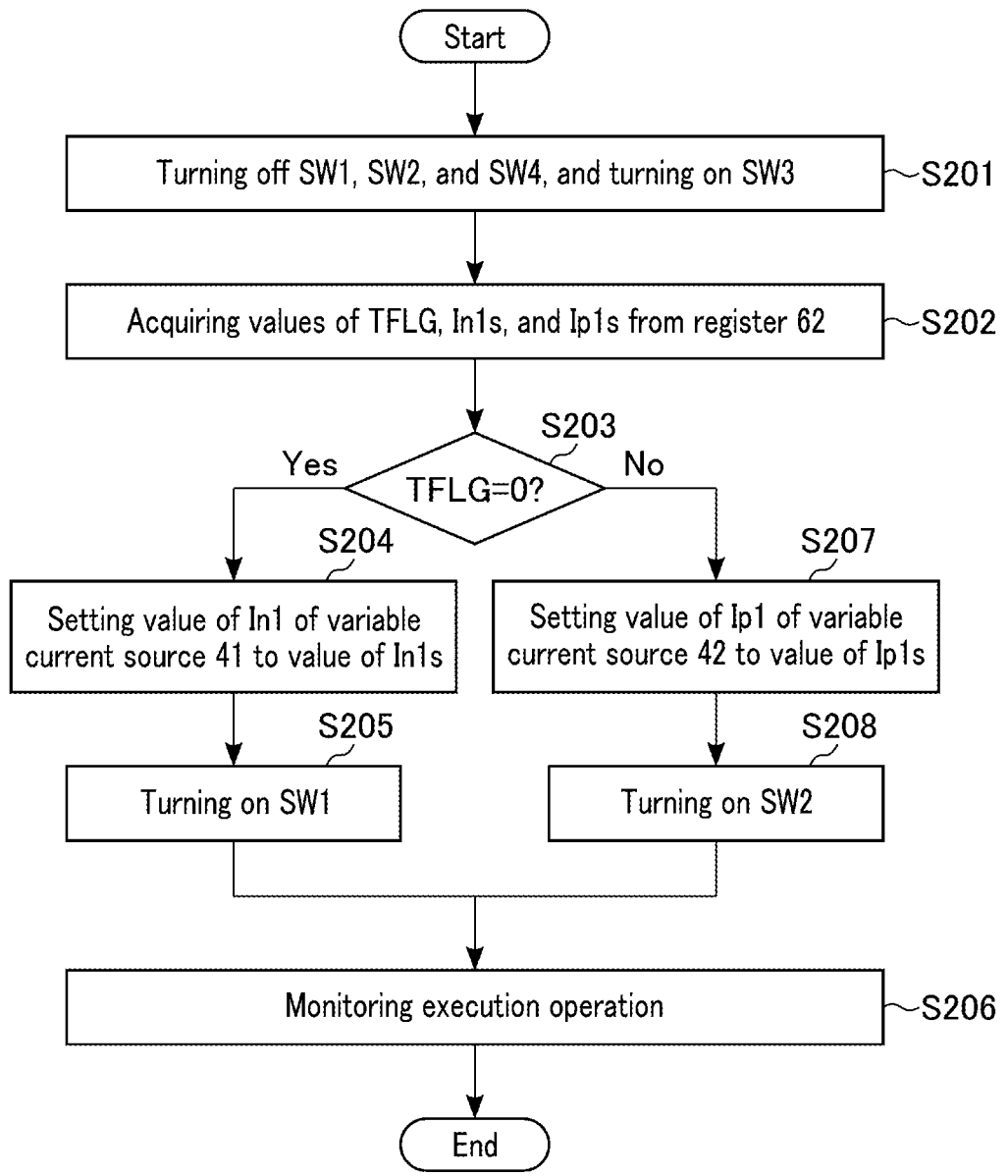
F I G. 10

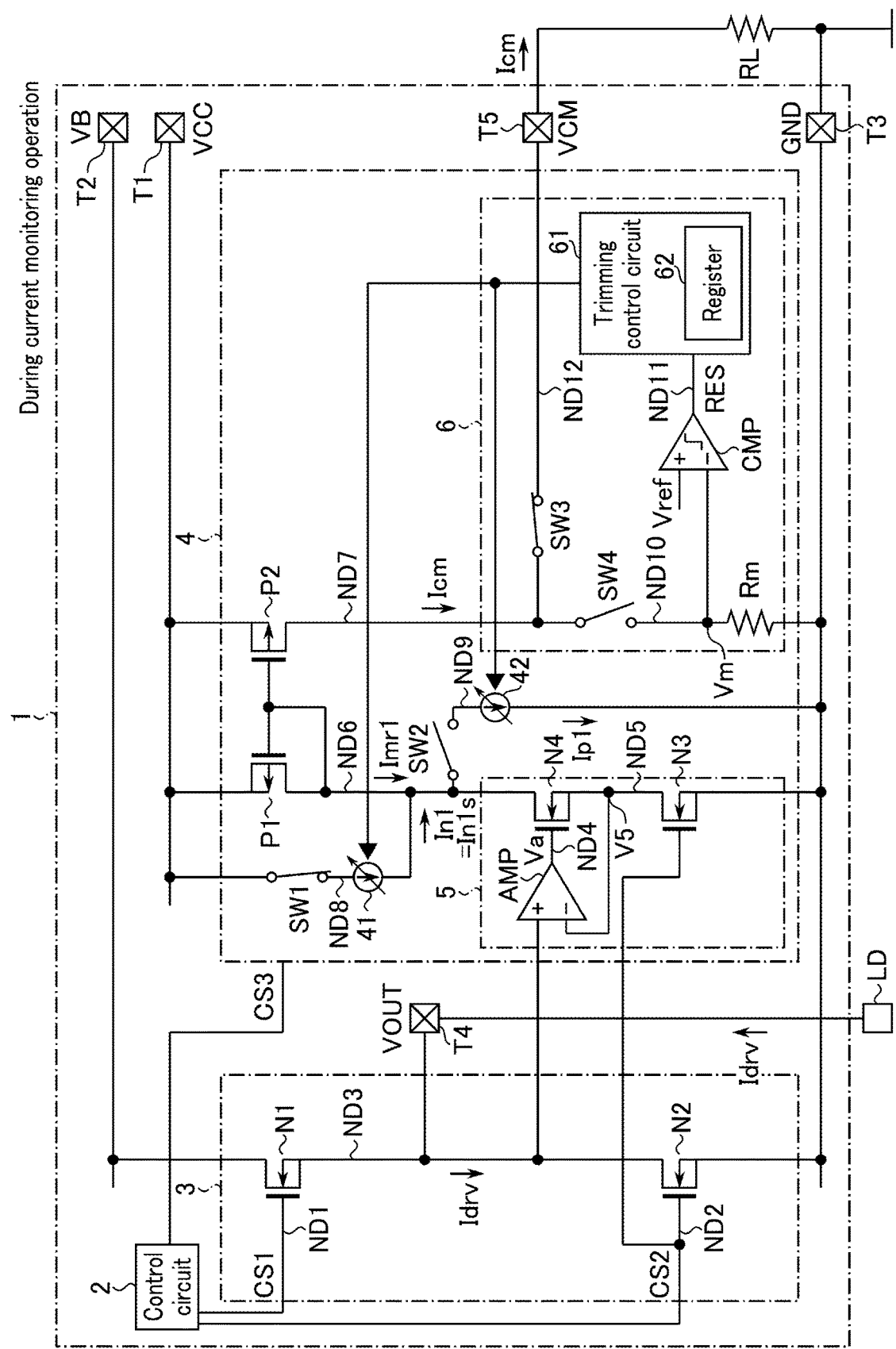
F I G. 11

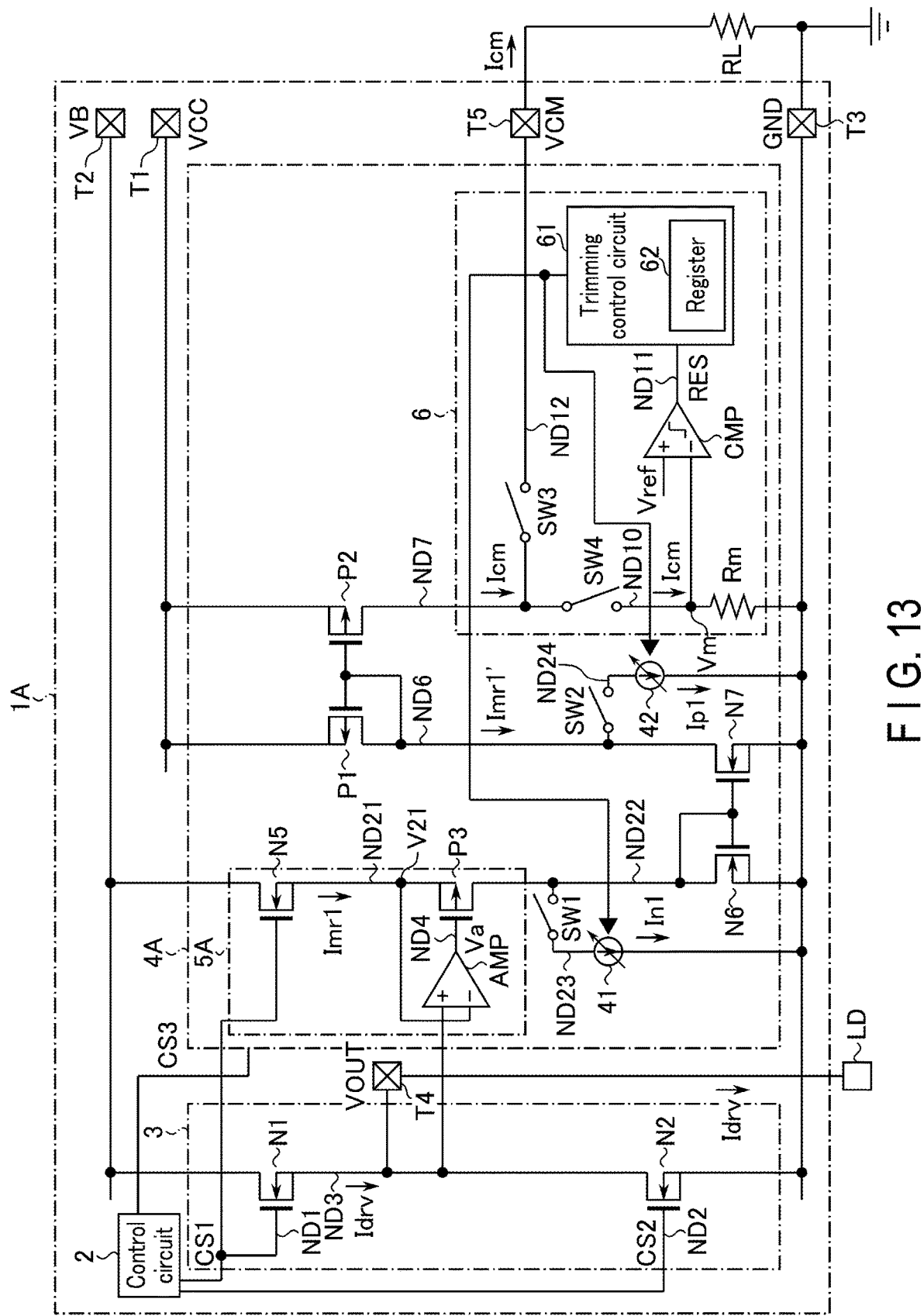
F I G. 13

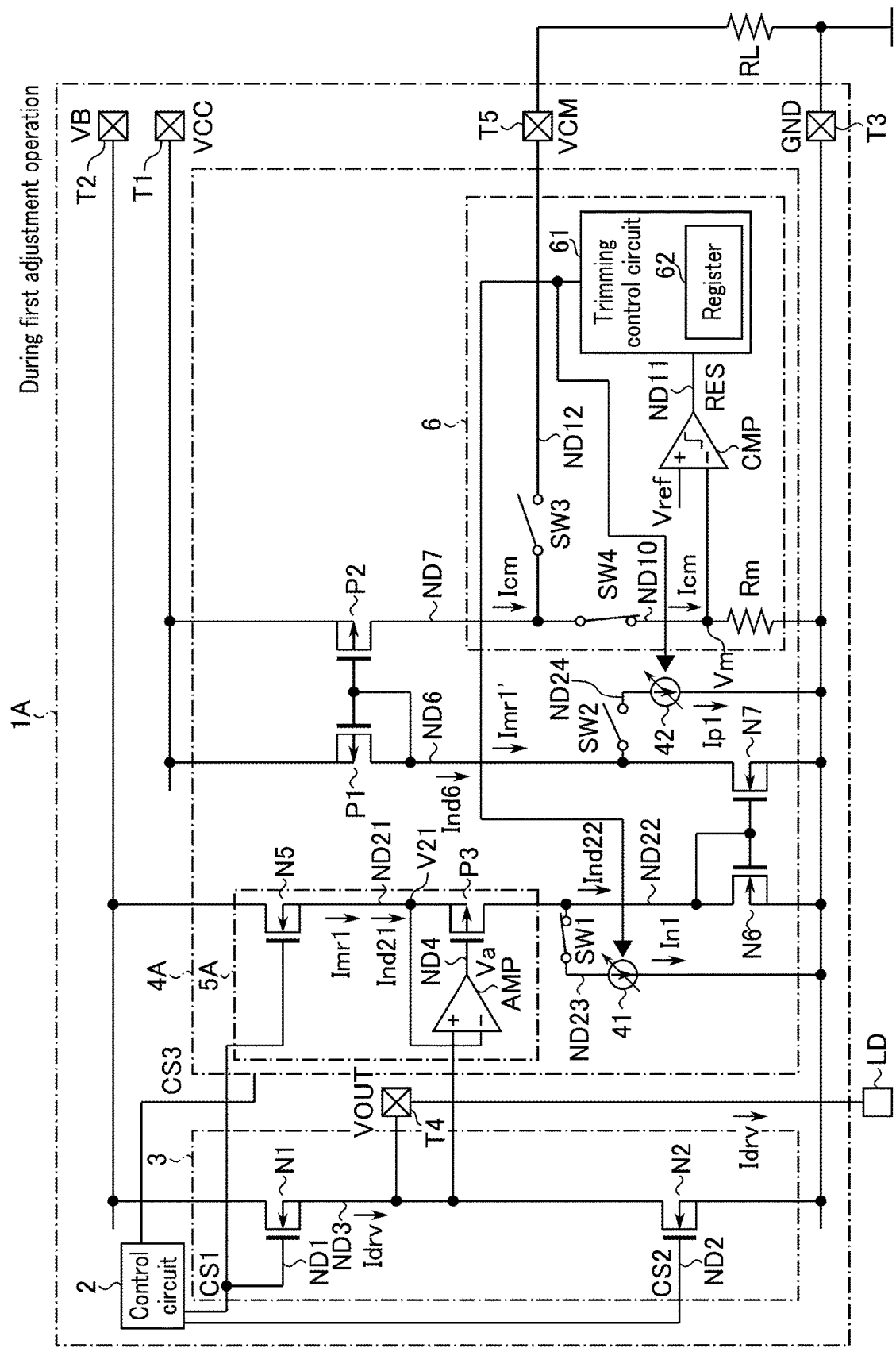
F I G. 14

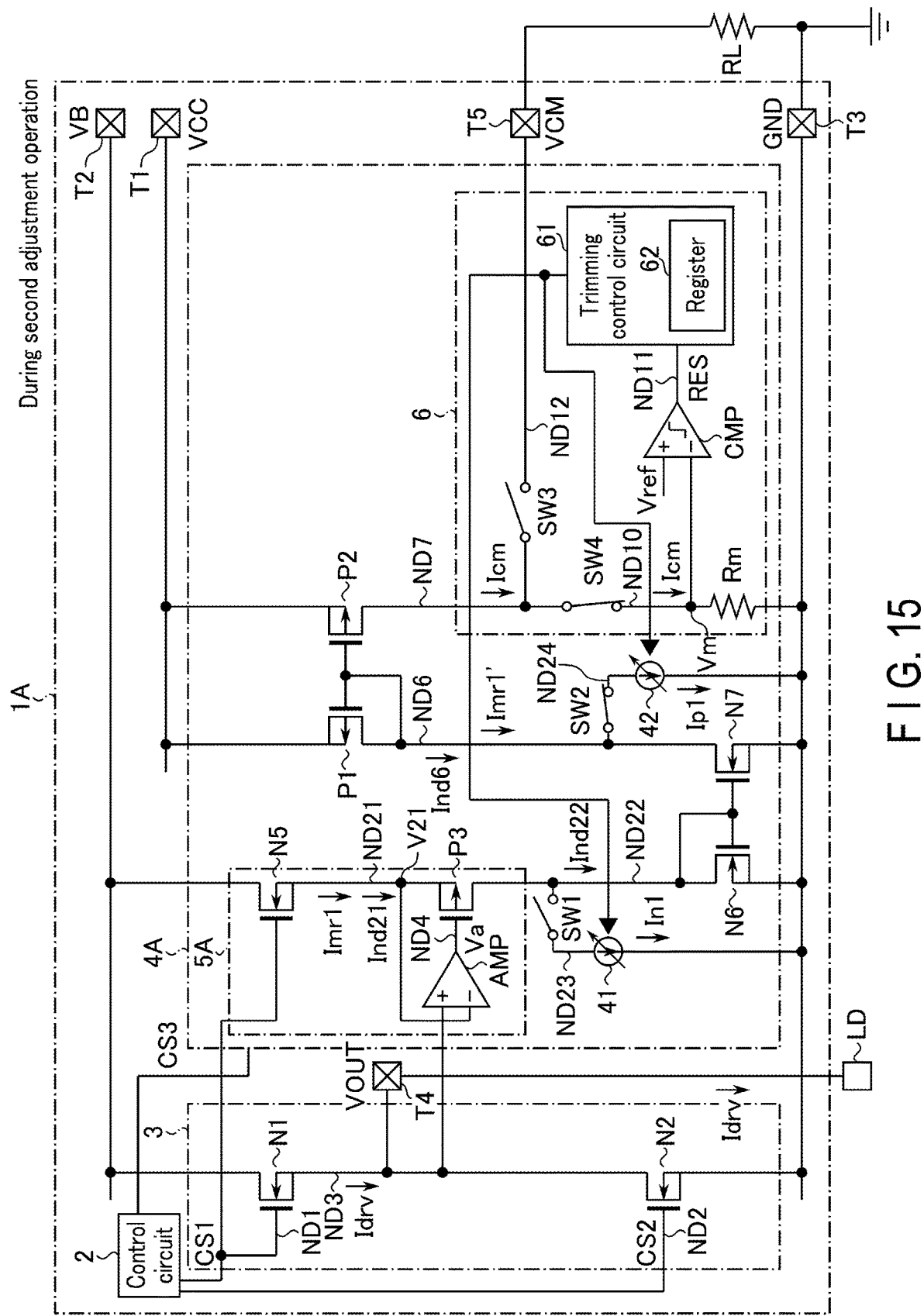
F I G. 15

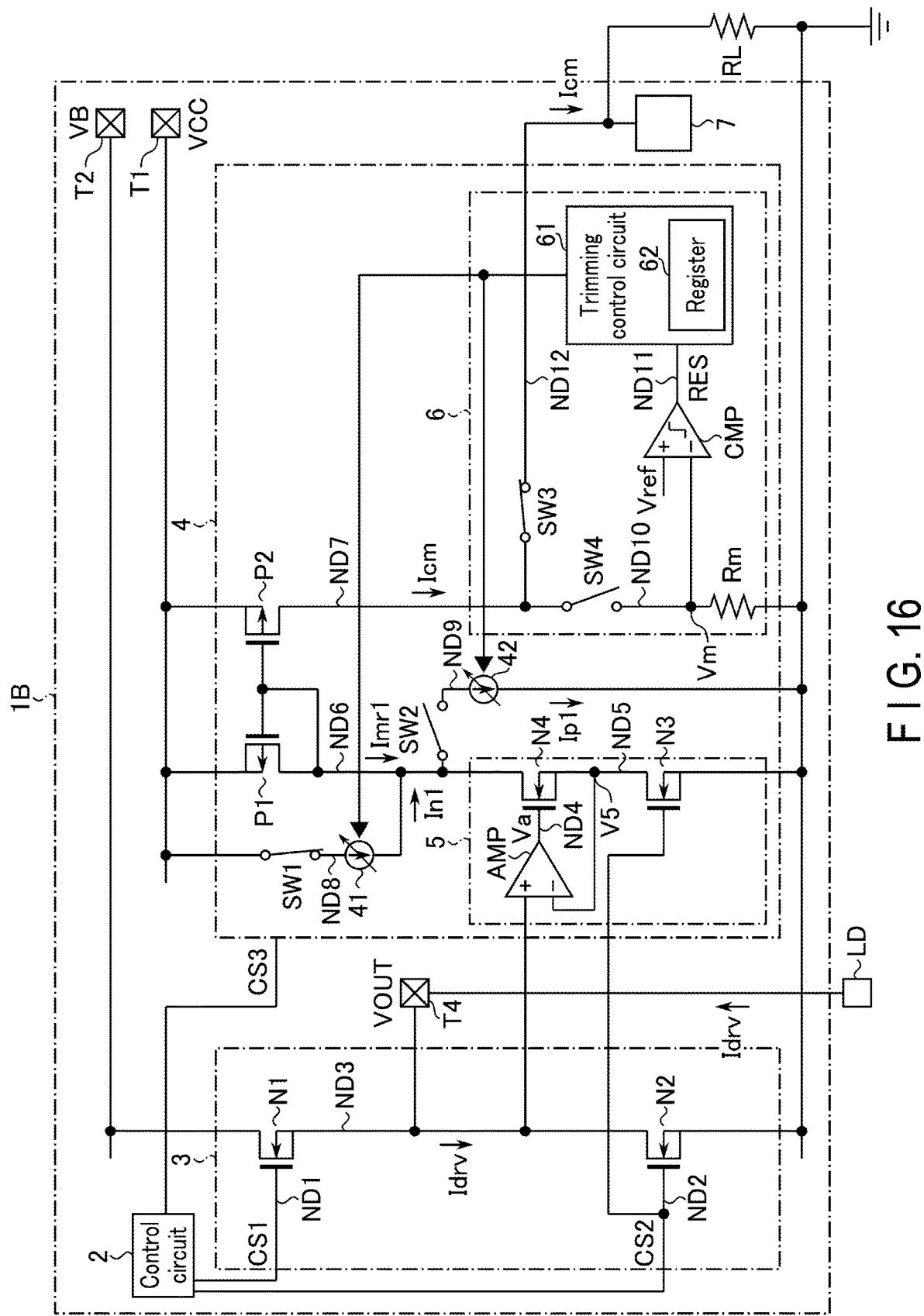
F I G. 16

SEMICONDUCTOR DEVICE

CROSS-REFERENCE TO RELATED APPLICATIONS

This application is based upon and claims the benefit of priority from Japanese Patent Application No. 2023-160083, filed Sep. 25, 2023, the entire contents of which are incorporated herein by reference.

FIELD

Embodiments described herein relate generally to a semiconductor device.

BACKGROUND

A semiconductor device including a driver circuit configured to drive an external load, and a current monitor circuit configured to monitor a current flowing into the load is known.

BRIEF DESCRIPTION OF THE DRAWINGS

FIG. 1 is a circuit diagram showing an example of a configuration of a semiconductor device according to a first embodiment.

FIG. 5 is a circuit diagram showing a coupling relationship during a first adjustment operation of the semiconductor device according to the first embodiment.

FIG. 10 is a flowchart showing an example of a current monitoring operation of the semiconductor device according to the first embodiment.

FIG. 11 is a circuit diagram showing a coupling relationship during the current monitoring operation of the semiconductor device according to the first embodiment.

FIG. 13 is a circuit diagram showing an example of a configuration of a semiconductor device according to a second embodiment.

FIG. 14 is a circuit diagram showing a coupling relationship during a first adjustment operation of the semiconductor device according to the second embodiment.

FIG. 15 is a circuit diagram showing a coupling relationship during a second adjustment operation of the semiconductor device according to the second embodiment.

FIG. 16 is a circuit diagram showing an example of a configuration of a semiconductor device according to a third embodiment.

DETAILED DESCRIPTION

Figure 2:
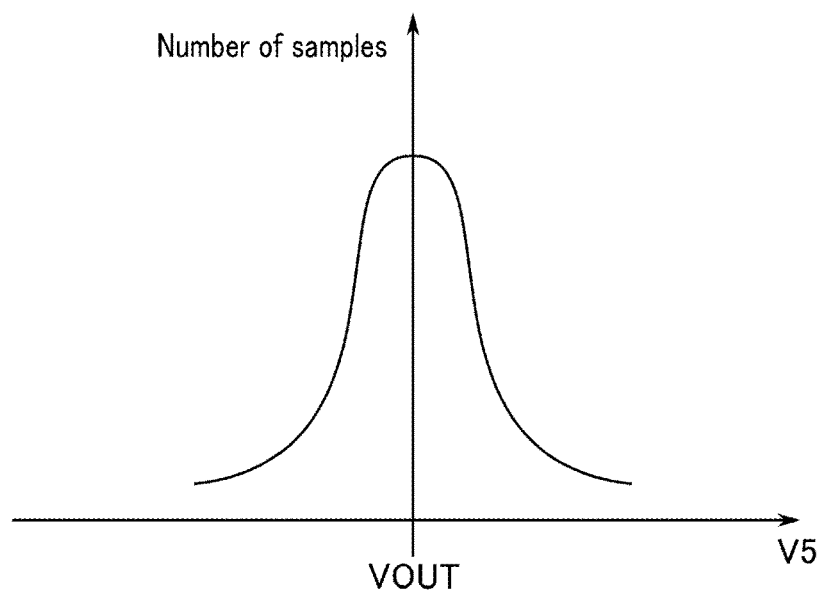
FIG. 2 is a diagram showing a distribution of a voltage applied to an inversion input terminal of an operational amplifier in a case where the operational amplifier has an input offset voltage and a load is absent in the semiconductor device according to the first embodiment.

In general, according to one embodiment, a semiconductor device includes: a first circuit configured to drive a load couplable to a first terminal by supplying a load current to the load; and a third circuit including a second circuit configured to copy the load current based on a first voltage of the first terminal and output a first current obtained by copying the load current, the third circuit being configured to monitor a second current based on the first current. The third circuit further includes a fourth circuit configured to adjust the second current in a case where the load current is not supplied to the load.

Hereinafter, embodiments will be described with reference to the accompanying drawings. In the following description, constituent elements having substantially the same function and configuration will be assigned the same reference symbol and repeat descriptions may be omitted. In the case where elements having similar configurations are distinguished from each other in particular, their identical reference symbols may be assigned different letters or numbers. All of the descriptions of an embodiment are applicable as descriptions of another embodiment, unless explicitly or self-evidently excluded.

1. First Embodiment

A semiconductor device according to a first embodiment will be described.

1.1 Configuration

1.1.1 Circuit Configuration of Semiconductor Device

A circuit configuration of the semiconductor device according to the present embodiment will be described with reference to FIG. 1. FIG. 1 is a circuit diagram showing an example of a configuration of the semiconductor device. In the following description, in the case where a source and a drain of a transistor are not distinguished from each other, one of them will be referred to as "one end of a transistor" and the other of them will be referred to as "the other end of the transistor or another end of the transistor".

A semiconductor device 1 is, for example, an integrated circuit (IC) chip. The semiconductor device 1 drives an external load LD by supplying a current to the load LD. The load LD is, for example, a motor. Hereinafter, a current supplied to (flowing into) the load LD will be referred to as a "load current". Furthermore, the semiconductor device 1 monitors the load current.

As shown in FIG. 1, the semiconductor device 1 includes a first power supply voltage terminal T1, a second power supply voltage terminal T2, a ground voltage terminal T3, an input/output terminal T4, a current monitor terminal T5, a control circuit 2, a driver circuit 3, and a current monitor circuit 4.

The first power supply voltage terminal T1 is a terminal configured to supply a power supply voltage VCC to circuits (for example, the current monitor circuit 4) within the semiconductor device 1. The power supply voltage VCC is supplied to the first power supply voltage terminal T1 from an outside of the semiconductor device 1.

The second power supply voltage terminal T2 is a terminal configured to supply a power supply voltage VB to circuits (for example, the driver circuit 3 and the current monitor circuit 4) within the semiconductor device 1. The voltage VB is, for example, a voltage higher than the voltage VCC. The power supply voltage VB is supplied to the second power supply voltage terminal T2 from an outside of the semiconductor device 1.

The ground voltage terminal T3 is a terminal configured to supply a ground voltage GND to circuits (for example, the driver circuit 3 and the current monitor circuit 4) within the semiconductor device 1. The ground voltage GND is supplied to the ground voltage terminal T3 from an outside of the semiconductor device 1. The ground voltage terminal T3 may be grounded.

The input/output terminal T4 is a terminal configured to supply the load current to the load LD. The input/output terminal T4 is coupled to the load LD. The load current is input to the input/output terminal T4 or is output therefrom. A voltage VOUT of the input/output terminal T4 is input to the input/output terminal T4 or is output therefrom.

The current monitor terminal T5 is a terminal configured to output a monitor current to be described later. The monitor current is, for example, a current obtained by multiplying the load current by 1/k (where k is an integer equal to or greater than 1). The current monitor terminal T5 is coupled to one end of a resistance element RL located outside of the semiconductor device 1, for example. The other end of the resistance element RL is grounded. The monitor current can be detected by detecting a voltage VCM of the current monitor terminal T5.

The control circuit 2 is a circuit configured to control the overall operation of the semiconductor device 1. The control circuit 2 controls operations of the driver circuit 3 and the current monitor circuit 4 based on a request signal (for example, a signal received from an outside of the semiconductor device 1, etc.) not shown. For example, based on the request signal, the control circuit 2 generates control signals CS1 and CS2 each for controlling the driver circuit 3 and a control signal CS3 for controlling the current monitor circuit 4.

The driver circuit 3 is a circuit configured to drive the load LD by supplying the load current to the load LD. The driver circuit 3 will be described later in detail.

The current monitor circuit 4 is a circuit configured to monitor the load current flowing into the load LD, or to be more specific, a current based on the load current. Furthermore, the current monitor circuit 4 adjusts the current based on the load current. The current monitor circuit 4 will be described later in detail.

1.1.2 Configuration of Driver Circuit

A circuit configuration of the driver circuit 3 will be described.

As shown in FIG. 1, the driver circuit 3 includes n-channel MOSFETs (Metal Oxide Semiconductor Field Effect Transistor) N1 and N2. Hereinafter, the n-channel MOSFET will be referred to as a "NMOS transistor".

The NMOS transistor N1 has, for example, a gate width W1. A gate of the NMOS transistor N1 is coupled to a node ND1. The control signal CS1 is input from the control circuit 2 to the node ND1. That is, the control signal CS1 is input to the gate of the NMOS transistor N1. One end of the NMOS transistor N1 is coupled to the second power supply voltage terminal T2. The other end of the NMOS transistor N1 is coupled to the node ND3.

The NMOS transistor N2 has, for example, a gate width W2. A gate of the NMOS transistor N2 is coupled to a node ND2. The control signal CS2 is input from the control circuit 2 to the node ND2. That is, the control signal CS2 is input to the gate of the NMOS transistor N2. The control signal CS2 is a signal obtained by inverting a logic level of the control signal CS1. One end of the NMOS transistor N2 is coupled to a node ND3. The other end of the NMOS transistor N2 is coupled to the ground voltage terminal T3.

The input/output terminal T4 is coupled to the node ND3. That is, the other end of the NMOS transistor N1 and one end of the NMOS transistor N2 are coupled to the input/output terminal T4.

In the case where the control signal CS1 is at an "H" level and the control signal CS2 is at an "L" level, the NMOS transistor N1 is turned on and the NMOS transistor N2 is turned off. This causes the load current to flow from the second power supply voltage terminal T2 into the load LD via the NMOS transistor N1 and the input/output terminal T4.

On the other hand, in the case where the control signal CS1 is at the "L" level and the control signal CS2 is at the "H" level, the NMOS transistor N1 is turned off and the NMOS transistor N2 is turned on. This causes the load current to flow into the load LD. That is, the load current flows from the load LD into the ground voltage terminal T3 via the input/output terminal T4 and the NMOS transistor N2. Hereinafter, the load current will be referred to as a "load current Idrv". FIG. 1 shows a state in which a load current Idrv flows from the load LD into the ground voltage terminal T3 via the input/output terminal T4 and the NMOS transistor N2.

1.1.3 Configuration of Current Monitor Circuit

A circuit configuration of the current monitor circuit 4 will be described. The semiconductor device 1 according to the present embodiment monitors the load current Idrv at the time when the load LD is driven by the NMOS transistor N2 of the driver circuit 3. That is, the current monitor circuit 4 is a current monitor circuit for a low side driving.

As shown in FIG. 1, the current monitor circuit 4 includes a mirror circuit 5, p-channel MOSFETs (Metal Oxide Semiconductor Field Effect Transistor) P1 and P2, switches SW1 and SW2, variable current sources 41 and 42, and a current adjustment circuit 6. Hereinafter, the p-channel MOSFET will be referred to as a "PMOS transistor".

The mirror circuit 5 is a circuit configured to copy the load current Idrv based on the voltage VOUT of the input/output terminal T4, and output the copied current. As shown in FIG. 1, the mirror circuit 5 includes NMOS transistors N3 and N4 and an operational amplifier AMP.

The NMOS transistor N3 has, for example, a gate width w2 (w2<W2). A gate of the NMOS transistor N3 is coupled to the node ND2. That is, the control signal CS2 is input to the gate of the NMOS transistor N3. One end of the NMOS transistor N3 is coupled to a node ND5. The other end of the NMOS transistor N3 is coupled to the ground voltage terminal T3.

The operational amplifier AMP includes a first input terminal, a second input terminal, and an output terminal. The first input terminal of the operational amplifier AMP is a non-inversion input terminal. The second input terminal of the operational amplifier AMP is an inversion input terminal. The first input terminal of the operational amplifier AMP is coupled to the node ND3. That is, the voltage VOUT of the input/output terminal T4 is applied to the first input terminal of the operational amplifier AMP. The second input terminal of the operational amplifier AMP is coupled to the node ND5. That is, a voltage V5 of the node ND5 is applied to the second input terminal of the operational amplifier AMP. The operational amplifier AMP outputs a voltage Va from its output terminal based on the voltage VOUT and the voltage V5. The output terminal of the operational amplifier AMP is coupled to a node ND4.

A gate of the NMOS transistor N4 is coupled to the node ND4. That is, the voltage Va is applied to the gate of the NMOS transistor N4. One end of the NMOS transistor N4 is coupled to a node ND6. The other end of the NMOS transistor N4 is coupled to the node ND5.

A gate of the PMOS transistor P1 is coupled to the node ND6. One end of the PMOS transistor P1 is coupled to the first power supply voltage terminal T1. The other end of the PMOS transistor P1 is coupled to the node ND6.

A gate of the PMOS transistor P2 is coupled to the node ND6. One end of the PMOS transistor P2 is coupled to the first power supply voltage terminal T1. The other end of the PMOS transistor P2 is coupled to a node ND7.

The switch SW1 is an element configured to switch coupling and uncoupling between the first power supply voltage terminal T1 and the variable current source 41. One end of the switch SW1 is coupled to the first power supply voltage terminal T1. The other end of the switch SW1 is coupled to a node ND8.

The switch SW2 is an element configured to switch coupling and uncoupling between the node ND6 and the variable current source 42. One end of the switch SW2 is coupled to the node ND6. The other end of the switch SW2 is coupled to a node ND9.

The variable current source 41 supplies a current In1 from the first power supply voltage terminal T1 to the node ND6. The current In1 is variable. One end of the variable current source 41 is coupled to the node ND8. The other end of the variable current source 41 is coupled to the node ND6.

The variable current source 42 supplies a current Ip1 from the node ND6 to the ground voltage terminal T3. The current Ip1 is variable. One end of the variable current source 42 is coupled to the node ND9. The other end of the variable current source 42 is coupled to the ground voltage terminal T3.

The operational amplifier AMP and the NMOS transistor N4 cause the operational amplifier AMP to output the voltage Va in such a manner that the voltage VOUT will be equal to the voltage V5. That is, the voltage V5 is controlled so as to be equal to the voltage VOUT. Accordingly, in the case where the load LD is driven by the NMOS transistor N2 and the load current Idrv flows into the load LD, the current Idrv×(w2/W2) flows from the first power supply voltage terminal T1 into the ground voltage terminal T3 via the PMOS transistor P1, the NMOS transistor N4, and the NMOS transistor N3. Hereinafter, this current will be referred to as a "copy current Imr1". Since the PMOS transistor P1 and the PMOS transistor P2 configure a current mirror, a current equal in magnitude to the current Imr1 flows from the first power supply voltage terminal T1 into the node ND7, too, via the PMOS transistor P2. Hereinafter, this current will be referred to as a "monitor current Icm". By coupling the node ND7 to the current monitor terminal T5, monitor current Icm can be monitored at the current monitor terminal T5. Since the monitor current Icm is smaller than the load current Idrv, power consumption of the current monitor circuit 4 can be decreased.

The operational amplifier AMP may have an input offset voltage. The input offset voltage varies over time. The input offset voltage also varies with the temperature or stress. In the case where the operational amplifier AMP has the input offset voltage, because of the input offset voltage, the voltage V5 of the node ND5 becomes a voltage shifted toward a plus side with respect to the voltage VOUT of the input/output terminal T4 or shifted toward a minus side with respect to the voltage VOUT.

In the case where the voltage V5 is shifted toward the plus side with respect to the voltage VOUT, a voltage between the gate and the source of the NMOS transistor N4 increases, so that the copy current Imr1 becomes greater than that in the case where the voltage V5 is equal to the voltage VOUT.

On the other hand, in the case where the voltage V5 is shifted toward the minus side with respect to the voltage VOUT, the voltage between the gate and the source of the NMOS transistor N4 decreases, so that the copy current Imr1 becomes smaller than that in the case where the voltage V5 is equal to the voltage VOUT.

Herein, the case where the load current Idrv is not supplied to the load LD, that is, the load current Idrv is equal to 0, will be discussed. Hereinafter, the case where the load current Idrv is not supplied to the load LD will be also referred to as "in the case where a load is absent". In the case where the load is absent and the voltage V5 is equal to the voltage VOUT, the copy current Imr1 becomes 0 and the monitor current Icm also becomes 0. In contrast, in the case where the load is absent and the voltage V5 is shifted toward the plus side with respect to the voltage VOUT, the copy current Imr1 becomes greater than the current value (=0) in the case of the voltage V5 being equal to the voltage VOUT, and the monitor current Icm also becomes greater than 0, as described above. On the other hand, in the case where the load is absent and the voltage V5 is shifted toward the minus side with respect to the voltage VOUT, the copy current Imr1 becomes smaller than the current value (=0) in the case of the voltage V5 being equal to the voltage VOUT, as described above. At this time, the monitor current Icm can output only 0.

From the above, in the case where the operational amplifier AMP has the input offset voltage and the load is absent, the voltage V5 exhibits such a distribution as shown in FIG. 2. FIG. 2 is a diagram showing a distribution of the voltage V5 in the case where the operational amplifier AMP has the input offset voltage and the load is absent. The vertical axis represents the number of samples. The horizontal axis represents the voltage V5 in the case where the load is absent.

As described above, the monitor current Icm in the case where the voltage V5 is shifted toward the plus side with respect to the voltage VOUT is distributed toward the plus side with respect to 0. The monitor current Icm in the case where the voltage V5 is shifted toward the minus side with respect to the voltage VOUT becomes 0.

Figure 3:
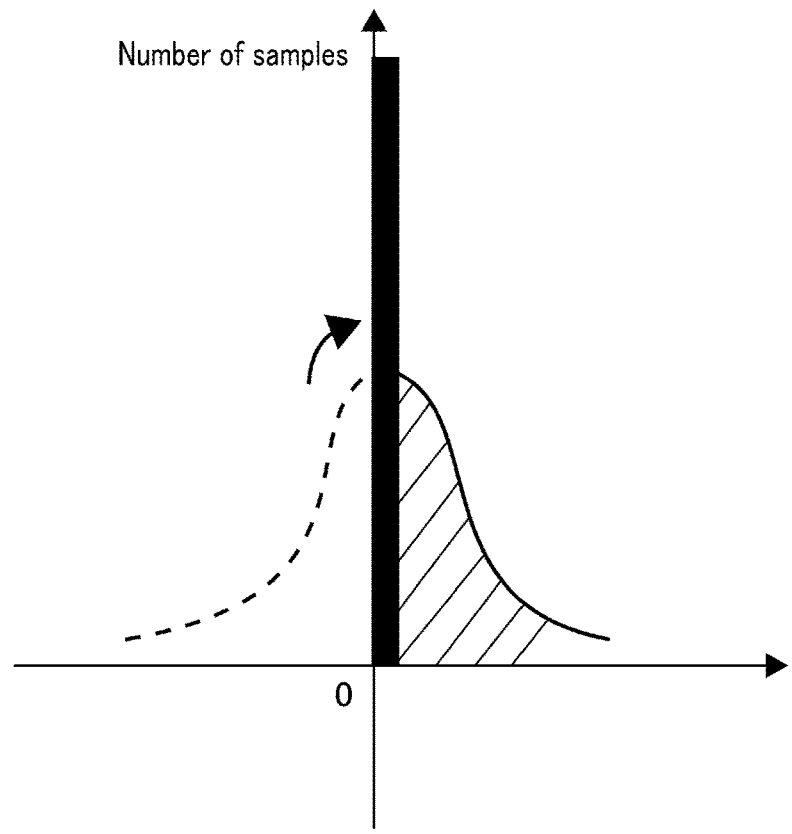
FIG. 3 is a diagram showing a distribution of a monitor current output from a current monitor terminal in a case where the operational amplifier has an input offset voltage and a load is absent in the semiconductor device according to the first embodiment.

In the case where the load is absent and the voltage V5 is shifted toward the minus side with respect to the voltage VOUT, the copy current Imr1 becomes smaller than 0 as described above. That is, the copy current Imr1 becomes a negative value. Therefore, in actuality, the copy current Imr1 does not flow into the nodes ND5 and ND6, and the monitor current Icm also does not flow into the node ND7. That is, the monitor current Icm output from the current monitor terminal T5 is only 0. Accordingly, in the case where the operational amplifier AMP has the input offset voltage and the load is absent, the monitor current Icm output from the current monitor terminal T5 exhibits such a distribution as shown in FIG. 3. FIG. 3 is a diagram showing a distribution of the monitor current Icm output from the current monitor terminal T5 in the case where the operational amplifier AMP has the input offset voltage and the load is absent. The vertical axis represents the number of samples. The horizontal axis represents the monitor current Icm in the case where the load is absent. In FIG. 3, a distribution of shift of the monitor current Icm with respect to 0 in the case of the voltage V5 being shifted with respect to the voltage VOUT is indicated by the broken line.

As shown in FIG. 3, the monitor current Icm output from the current monitor terminal T5 in the case of the voltage V5 being shifted toward the plus side with respect to the voltage VOUT is distributed toward the plus side with respect to 0. The monitor current Icm output from the current monitor terminal T5 in the case of the voltage V5 being shifted toward the minus side with respect to the voltage VOUT is not distributed toward the minus side with respect to 0 but is distributed on 0.

As described above, in the case where the operational amplifier AMP has the input offset voltage and the load is absent, monitor current Icm may not become 0 under the effect of the input offset voltage. That is, a deviation (shift toward the plus side or the minus side with respect to 0) may occur in the monitor current Icm.

While the load LD is driven, the relatively large current Idrv flows into the load LD. In the case where the load current Idrv is relatively large, the deviation of the monitor current Icm is smaller than the load current Idrv. In such a case, there is a low probability that a measurement accuracy of the monitor current Icm will be deteriorated. However, in the case where the load current Idrv is equal to 0, the deviation of the monitor current Icm is greater than 0. In such a case, there is a possibility that the measurement accuracy of the monitor current Icm will be deteriorated.

The current adjustment circuit 6 is a circuit configured to adjust the monitor current Icm to approach 0 in the case where the load is absent. More specifically, the current adjustment circuit 6 adjusts the monitor current Icm in such a manner as that the distribution of shift of the monitor current Icm with respect to 0 as indicated by the broken line in FIG. 3 is converged toward 0. As shown in FIG. 1, the current adjustment circuit 6 includes switches SW3 and SW4, a resistance element Rm, a comparator CMP, and a trimming control circuit 61.

The switch SW3 is an element configured to switch coupling and uncoupling between the node ND7 and the current monitor terminal T5. One end of the switch SW3 is coupled to the node ND7. The other end of the switch SW3 is coupled to a node ND12.

The switch SW4 is an element configured to switch coupling and uncoupling between the node ND7 and the resistance element Rm. One end of the switch SW4 is coupled to the node ND7. The other end of the switch SW4 is coupled to a node ND10.

One end of the resistance element Rm is coupled to the node ND10. The other end of the resistance element Rm is coupled to the ground voltage terminal T3. A resistance value of the resistance element Rm is set in consideration of, for example, the trimming amount to be described later.

The comparator CMP includes a first input terminal, a second input terminal, and an output terminal. The first input terminal of the comparator CMP is an inversion input terminal. The second input terminal of the comparator CMP is a non-inversion input terminal. The first input terminal of the comparator CMP is coupled to the node ND10. That is, a voltage Vm of the node ND10 is applied to the first input terminal of the comparator CMP. A reference voltage Vref is applied to the second input terminal of the comparator CMP. The comparator CMP makes a comparison between the voltage Vm and the voltage Vref and outputs a result of the comparison from the output terminal. Hereinafter, the result of the comparison will be referred to as a "comparison result RES". In the case where the voltage Vm is equal to or greater than the voltage Vref, the comparator CMP outputs a signal at the "L" level as the comparison result RES. On the other hand, in the case where the voltage Vm is smaller than the voltage Vref, the comparator CMP outputs a signal at the "H" level as the comparison result RES. The output terminal of the comparator CMP is coupled to a node ND11. The reference voltage Vref is set in consideration of, for example, a value obtained by converting the input offset voltage into a current and the resistance value of the resistance element Rm. Furthermore, the reference voltage Vref is set to a voltage in such a manner that the monitor current Icm flows into the node ND10 in the case of the voltage Vm being equal to or greater than the voltage Vref, and that the monitor current Icm does not flow into the node ND10 in the case of the voltage Vm being smaller than the voltage Vref. For example, in the case of the resistance element Rm being 200 kΩ and the trimming amount to be describe later being 1 µA, the reference voltage Vref is set to 0.1 V.

The trimming control circuit 61 is a circuit configured to adjust the monitor current Icm based on the comparison result RES. More specifically, the trimming control circuit 61 adjusts the monitor current Icm by adjusting a current value of the variable current source 41 or a current value of the variable current source 42 based on the comparison result RES. Hereinafter, adjusting a current value of the variable current source 41 or a current value of the variable current source 42 will also be referred to as "trimming". Furthermore, the trimming control circuit 61 controls switches SW1 to SW4. As shown in FIG. 1, the trimming control circuit 61 includes a register 62.

The register 62 is a circuit configured to store a result of the adjustment by the current adjustment circuit 6. The result of the adjustment by the current adjustment circuit 6 includes, for example, the current value of the variable current source 41 and the current value of the variable current source 42.

As described above, the current adjustment circuit 6 compares the voltage Vm obtained by converting the monitor current Icm into a voltage with the reference voltage Vref and makes an adjustment based on the comparison result RES in such a manner that the monitor current Icm approaches 0.

1.2. Operation

The semiconductor device 1 includes a load drive operation, a current monitoring operation, and a current adjustment operation. The load drive operation is an operation that drives the load LD by supplying the load current Idrv to the load LD. The current monitoring operation is an operation that monitors the monitor current Icm based on the load current Idrv. The current adjustment operation is an operation that makes an adjustment in such a manner that the monitor current Icm approaches 0 in the case where the load is absent.

1.2.1 Current Adjustment Operation

The current adjustment operation will be described. The current adjustment operation includes a determination operation, a first adjustment operation, and a second adjustment operation. Hereinafter, first, each of the determination operation, the first adjustment operation, and the second adjustment operation will be described.

(Determination Operation)

The determination operation is an operation that makes a determination in the case where the load is absent as to whether the monitor current Icm shifts toward the plus side or the minus side with respect to the current value (=0) in the case of the voltage V5 of the node ND5 being equal to the voltage VOUT of the input/output terminal T4.

Figure 4:
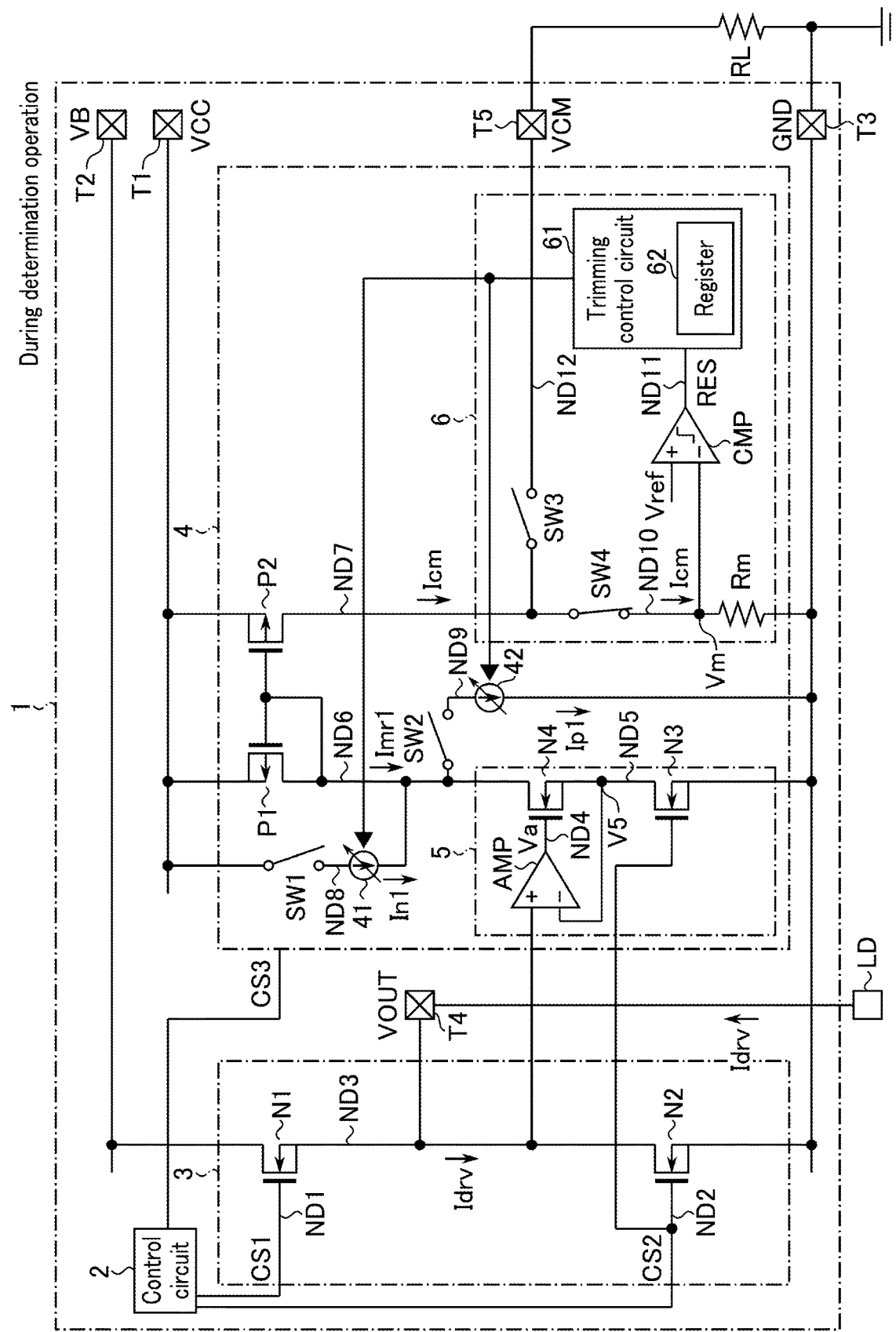
FIG. 4 is a circuit diagram showing a coupling relationship during a determination operation of the semiconductor device according to the first embodiment.

FIG. 4 is a circuit diagram showing a coupling relationship during the determination operation of the semiconductor device 1. As shown in FIG. 4, upon the initiation of the determination operation, the trimming control circuit 61 turns off the switches SW1 to SW3 and turns on the switch SW4. The trimming control circuit 61 then makes a determination based on the comparison result RES output from the comparator CMP as to whether the monitor current Icm is shifted toward the plus side or the minus side with respect to 0. In the case where the load is absent and the monitor current Icm flows into the node ND10, the voltage Vm of the node ND10 becomes equal to or greater than the reference voltage Vref. On the other hand, in the case where the load is absent and the monitor current Icm does not flow into the node ND10, the voltage Vm of the node ND10 becomes smaller than the reference voltage Vref. Therefore, in the case where the comparison result RES is at the "L" level, the trimming control circuit 61 determines that the monitor current Icm shifts toward the plus side with respect to 0. On the other hand, in the case where the comparison result RES is at the "H" level, the trimming control circuit 61 determines that the monitor current Icm shifts toward the minus side with respect to 0.

(First Adjustment Operation)

The first adjustment operation is an operation that makes an adjustment in such a manner that the monitor current Icm approaches 0 in the case where the load is absent and the determination operation makes a determination that monitor current Icm has shifted toward to the plus side with respect to 0 (the case where the voltage Vm is equal to or greater than the reference voltage Vref).

FIG. 5 is a circuit diagram showing a coupling relationship during the first adjustment operation of the semiconductor device 1. Hereinafter, a current flowing into the node ND5 will be referred to as a "current Ind5". A current flowing into the node ND6 will be referred to as a "current Ind6".

As shown in FIG. 5, upon the initiation of the first adjustment operation, the trimming control circuit 61 turns on the switches SW1 and SW4 and turns off the switches SW2 and SW3. The trimming control circuit 61 then increases the current In1 of the variable current source 41 and selects a value of the current In1 in the first loop processing to be described later one time before the first loop processing in which the comparison result RES output from the comparator CMP transitions from the "L" level to the "H" level.

Figure 6:
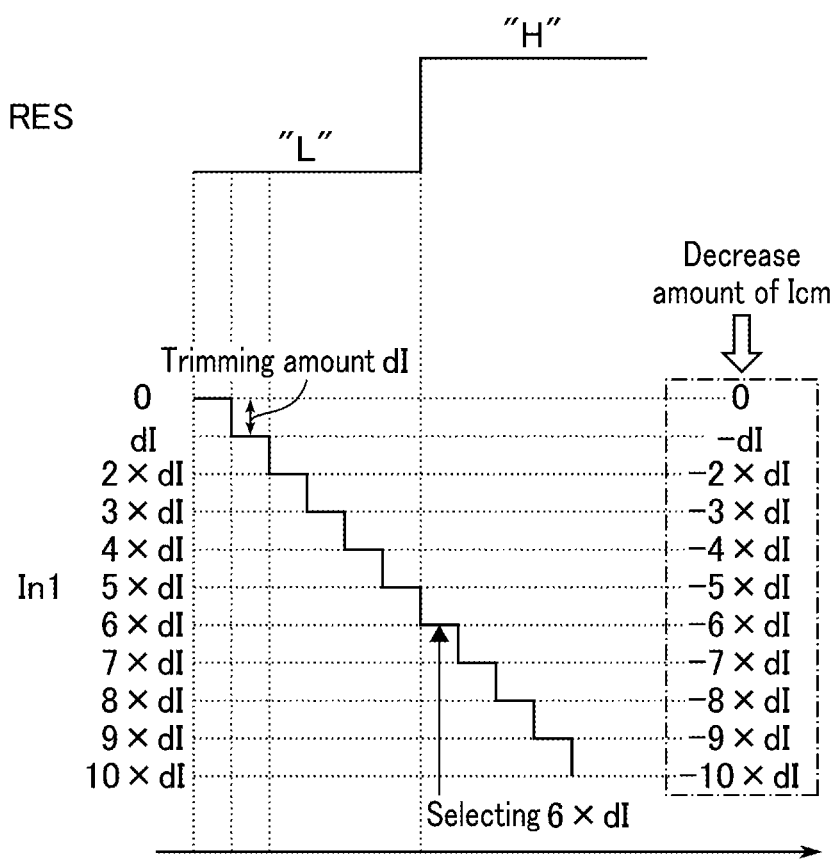
FIG. 6 is a diagram showing an example of a relationship between a transition in value of a current and a transition in value of a comparison result of voltages during execution of the first adjustment operation of the semiconductor device according to the first embodiment.

A method of selecting a value of the current In1 will be described with reference to FIG. 6. FIG. 6 is a diagram showing an example of a relationship between a transition in value of the current In1 and a transition in value of the comparison result RES during execution of the first adjustment operation.

Upon the initiation of the first adjustment operation in the case where the load is absent, the trimming control circuit 61 sets a value of the current In1 of the variable current source 41 to 0. At this time, the load is absent and the monitor current Icm flows into the node ND10. That is, the monitor current Icm shifts toward the plus side with respect to 0. Accordingly, the comparison result RES becomes the "L" level.

The trimming control circuit 61 decreases the monitor current Icm in order for the monitor current Icm to approach 0. For example, the trimming control circuit 61 decreases the monitor current Icm by the predetermined trimming amount dI (increases the current In1 by the trimming amount dI). The trimming amount dI is, for example, 10 μA. The trimming control circuit 61 then determines whether or not the comparison result RES has transitioned from the "L" level to the "H" level.

In the case where the comparison result RES has not transitioned to the "H" level, the monitor current Icm flows into the node ND10. Therefore, the trimming control circuit 61 further decreases the monitor current Icm by the trimming amount dI and determines whether or not the comparison result RES has transitioned from the "L" level to the "H" level. For example, the trimming control circuit 61 further decreases by the trimming amount dI the monitor current Icm decreased by the trimming amount dI (further increases by the trimming amount dI the current In1 increased by the trimming amount dI). That is, the trimming control circuit 61 sets the total decrease amount of the monitor current Icm to −2×dI (sets a value of the current In1 to 2×dI). The trimming control circuit 61 then determines whether or not the comparison result RES has transitioned from the "L" level to the "H" level. Hereinafter, in the case where the comparison result RES has not transitioned to the "H" level, as described above, a combination of the processing of decreasing the monitor current Icm by the trimming amount dI (processing of increasing the current In1 by the trimming amount dI) and the processing of determining whether or not a logic level of the comparison result RES has transitioned (hereinafter, this combination will be referred to as a "first loop processing") is repeated.

On the other hand, in the case where the comparison result RES has transitioned to the "H" level, the monitor current Icm does not flow into the node ND10. Therefore, the trimming control circuit 61 selects the value of the current In1 in the trimming (the first loop processing) one time before the present trimming. In the example shown in FIG. 6, the comparison result RES transitions to the "H" level at the time when the trimming control circuit 61 sets a value of the current In1 to 6×dI. Accordingly, the trimming control circuit 61 selects 6×dI as a value of the current In1.

As described above, by repeatedly executing the first loop processing, the trimming control circuit 61 selects, as the current In1, a value of the current In1 in the first loop processing one time before the first loop processing in which the logic level of the comparison result RES has transitioned. The trimming control circuit 61 then adjusts the value of the current In1 to the selected value of the current In1.

The example shown in FIG. 6 will be further described with reference to FIG. 5. In the example shown in FIG. 6, a deviation of the monitor current Icm (shift toward the plus side with respect to 0) is 6×dI.

As shown in FIG. 5, in the case of the current In1=0, the current In1 does not flow into the node ND8. The current Ind5=Imr1=6×dI flows into the node ND5. The current Ind6=Ind5−In1=6×dI flows into the node ND6. Accordingly, the monitor current Icm=Ind6=6×dI flows into the node ND10.

In the case of the current In1=dI, the current In1=dI flows into the node ND8. The current Ind5=6×dI flows into the node ND5. The current Ind6=5×dI flows into the node ND6. Accordingly, the monitor current Icm=5×dI flows into the node ND10.

In the case of the current In1=2×dI, the current In1=2×dI flows into the node ND8. The current Ind5=6×dI flows into the node ND5. The current Ind6=4×dI flows into the node ND6. Accordingly, the monitor current Icm=4×dI flows into the node ND10.

In the case of the current In1=3×dI, the current In1=3×dI flows into the node ND8. The current Ind5=6×dI flows into the node ND5. The current Ind6=3×dI flows into the node ND6. Accordingly, the monitor current Icm=3×dI flows into the node ND10.

In the case of the current In1=4×dI, the current In1=4×dI flows into the node ND8. The current Ind5=6×dI flows into the node ND5. The current Ind6=2×dI flows into the node ND6. Accordingly, the monitor current Icm=2×dI flows into the node ND10.

In the case of the current In1=5×dI, the current In1=5×dI flows into the node ND8. The current Ind5=6×dI flows into the node ND5. The current Ind6=dI flows into the node ND6. Accordingly, the monitor current Icm=dI flows into the node ND10.

In the case of the current In1=6×dI, the current In1=6×dI flows into the node ND8. The current Ind5=6×dI flows into the node ND5. The current Ind6 does not flow into the node ND6 (Ind6=0). Accordingly, the monitor current Icm does not flow into the node ND10 (Icm=0).

Accordingly, the trimming control circuit 61 selects 6×dI as a value of the current In1. By performing the first adjustment operation in this manner, the monitor current Icm is adjusted to approach 0.

(Second Adjustment Operation)

The second adjustment operation is an operation that makes an adjustment in such a manner that the monitor current Icm approaches 0 in the case where the load is absent and the determination operation makes a determination that the monitor current Icm has shifted toward to the minus side with respect to 0 (the case where the voltage Vm is smaller than the reference voltage Vref).

Figure 7:
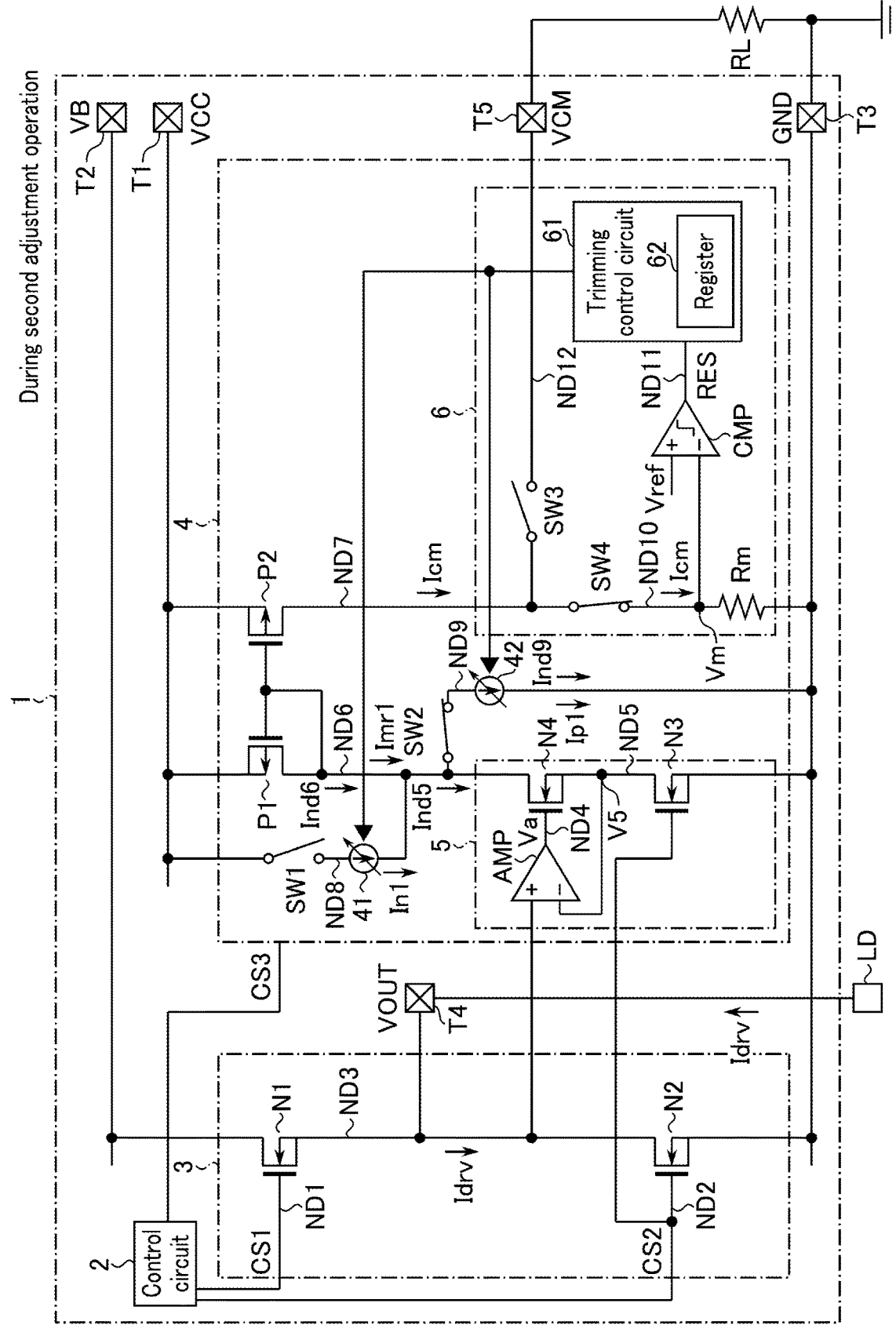
FIG. 7 is a circuit diagram showing a coupling relationship during a second adjustment operation of the semiconductor device according to the first embodiment.

FIG. 7 is a circuit diagram showing a coupling relationship during the second adjustment operation of the semiconductor device 1. Hereinafter, a current flowing into the node ND9 will be referred to as a "current Ind9".

As shown in FIG. 7, upon the initiation of the second adjustment operation, the trimming control circuit 61 turns on the switches SW2 and SW4 and turns off the switches SW1 and SW3. The trimming control circuit 61 then increases the current Ip1 of the variable current source 42 and selects a value of the current Ip1 in the second loop processing to be described later one time before the second loop processing in which the comparison result RES transitions from the "H" level to the "L" level.

Figure 8:
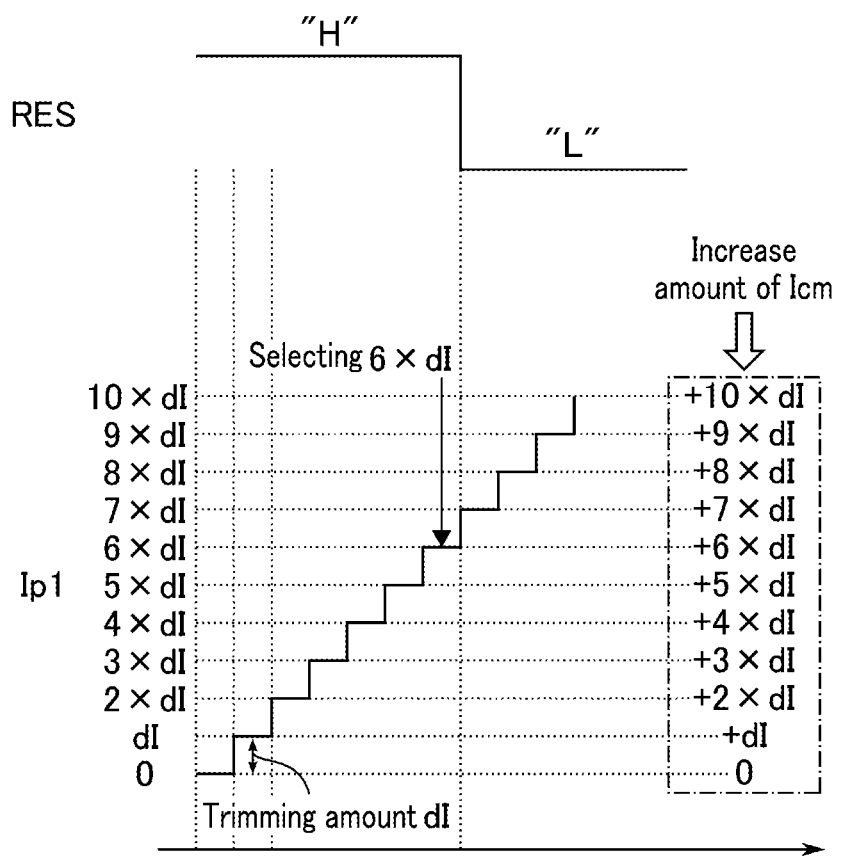
FIG. 8 is a diagram showing an example of a relationship between a transition in value of a current and a transition in value of a comparison result of voltages during execution of the second adjustment operation of the semiconductor device according to the first embodiment.

A method of selecting a value of the current Ip1 will be described with reference to FIG. 8. FIG. 8 is a diagram showing an example of a relationship between a transition in value of the current Ip1 and a transition in value of the comparison result RES during execution of the second adjustment operation.

Upon the initiation of the second adjustment operation in the case where the load is absent, the trimming control circuit 61 sets a value of the current Ip1 of the variable current source 42 to 0. At this time, the load is absent and the monitor current Icm does not flow into the node ND10. That is, the monitor current Icm shifts toward the minus side with respect to 0. Accordingly, the comparison result RES becomes the "H" level.

The trimming control circuit 61 increases the monitor current Icm in order for the monitor current Icm to approach 0. For example, the trimming control circuit 61 increases the monitor current Icm by the trimming amount dI (increases the current Ip1 by the trimming amount dI). The trimming control circuit 61 then determines whether or not the comparison result RES has transitioned from the "H" level to the "L" level.

In the case where the comparison result RES has not transitioned to the "L" level, the monitor current Icm does not flow into the node ND10. Therefore, the trimming control circuit 61 further increases the monitor current Icm by the trimming amount dI and determines whether or not the comparison result RES has transitioned from the "H" level to the "L" level. For example, the trimming control circuit 61 further increases by the trimming amount dI the monitor current Icm increased by the trimming amount dI (further increases by the trimming amount dI the current Ip1 increased by the trimming amount dI). That is, the trimming control circuit 61 sets the total increase amount of the monitor current Icm to +2×dI (sets a value of the current Ip1 to 2×dI). The trimming control circuit 61 then determines whether or not the comparison result RES has transitioned from the "H" level to the "L" level. Hereinafter, in the case where the comparison result RES has not transitioned to the "L" level, as described above, a combination of the processing of increasing the monitor current Icm by the trimming amount dI (processing of increasing the current Ip1 by the trimming amount dI) and the processing of determining whether or not the logic level of the comparison result RES has transitioned (hereinafter, this combination will be referred to as a "second loop processing") is repeated.

On the other hand, in the case where the comparison result RES has transitioned to the "L" level, the monitor current Icm flows into the node ND10. Therefore, the trimming control circuit 61 selects the value of the current Ip1 in the trimming (the second loop processing) one time before the present trimming. In the example shown in FIG. 8, the comparison result RES transitions to the "L" level at the time when the trimming control circuit 61 sets a value of the current Ip1 to 7×dI. Accordingly, the trimming control circuit 61 selects 6×dI as a value of the current Ip1.

As described above, by repeatedly executing the second loop processing, the trimming control circuit 61 selects, as the current Ip1, a value of the current Ip1 in the second loop processing one time before the second loop processing in which the logic level of the comparison result RES has transitioned. The trimming control circuit 61 then adjusts the value of the current Ip1 to the selected value of the current Ip1.

The example shown in FIG. 8 will be further described with reference to FIG. 7. In the example shown in FIG. 8, a deviation of the monitor current Icm (shift toward the minus side with respect to 0) is −6×dI.

As shown in FIG. 7, in the case of the current Ip1=0, the current Ip1 does not flow into the node ND9. The current Ind5 does not flow into the node ND5 (Ind5=Imr1=−6×dI). The current Ind6 does not flow into the node ND6 (Ind6=Ind5+Ip1=−6×dI). The monitor current Icm does not flow into the node ND10 (Icm=Ind6=−6×dI).

In the case of the current Ip1=dI, the current Ip1=dI flows into the node ND9. The current Ind5 does not flow into the node ND5 (Ind5=−6×dI). The current Ind6 does not flow into the node ND6 (Ind6=−5×dI). The monitor current Icm does not flow into the node ND10 (Icm=−5×dI).

In the case of the current Ip1=2×dI, the current Ip1=2×dI flows into the node ND9. The current Ind5 does not flow into the node ND5 (Ind5=−6×dI). The current Ind6 does not flow into the node ND6 (Ind6=−4×dI). The monitor current Icm does not flow into the node ND10 (Icm=−4×dI).

In the case of the current Ip1=3×dI, the current Ip1=3×dI flows into the node ND9. The current Ind5 does not flow into the node ND5 (Ind5=−6×dI). The current Ind6 does not flow into the node ND6 (Ind6=−3×dI). The monitor current Icm does not flow into the node ND10 (Icm=−3×dI).

In the case of the current Ip1=4×dI, the current Ip1=4×dI flows into the node ND9. The current Ind5 does not flow into the node ND5 (Ind5=−6×dI). The current Ind6 does not flow into the node ND6 (Ind6=−2×dI). The monitor current Icm does not flow into the node ND10 (Icm=−2×dI).

In the case of the current Ip1=5×dI, the current Ip1=5×dI flows into the node ND9. The current Ind5 does not flow into the node ND5 (Ind5=−6×dI). The current Ind6 does not flow into the node ND6 (Ind6=−dI). The monitor current Icm does not flow into the node ND10 (Icm=−dI).

In the case of the current Ip1=6×dI, the current Ip1=6×dI flows into the node ND9. The current Ind5 does not flow into the node ND5 (Ind5=−6×dI). The current Ind6 does not flow into the node ND6 (Ind6=0). The monitor current Icm does not flow into the node ND10 (Icm=0).

In the case of the current Ip1=7×dI, the current Ip1=7×dI flows into the node ND9. The current Ind5 does not flow into the node ND5 (Ind5=−6×dI). The current Ind6=dI flows into the node ND6. The monitor current Icm=dI flows into the node ND10.

Accordingly, the trimming control circuit 61 selects 6×dI as a value of the current Ip1. By performing the second adjustment operation in this manner, the monitor current Icm is adjusted to approach 0.

(Flowchart)

Figure 9:
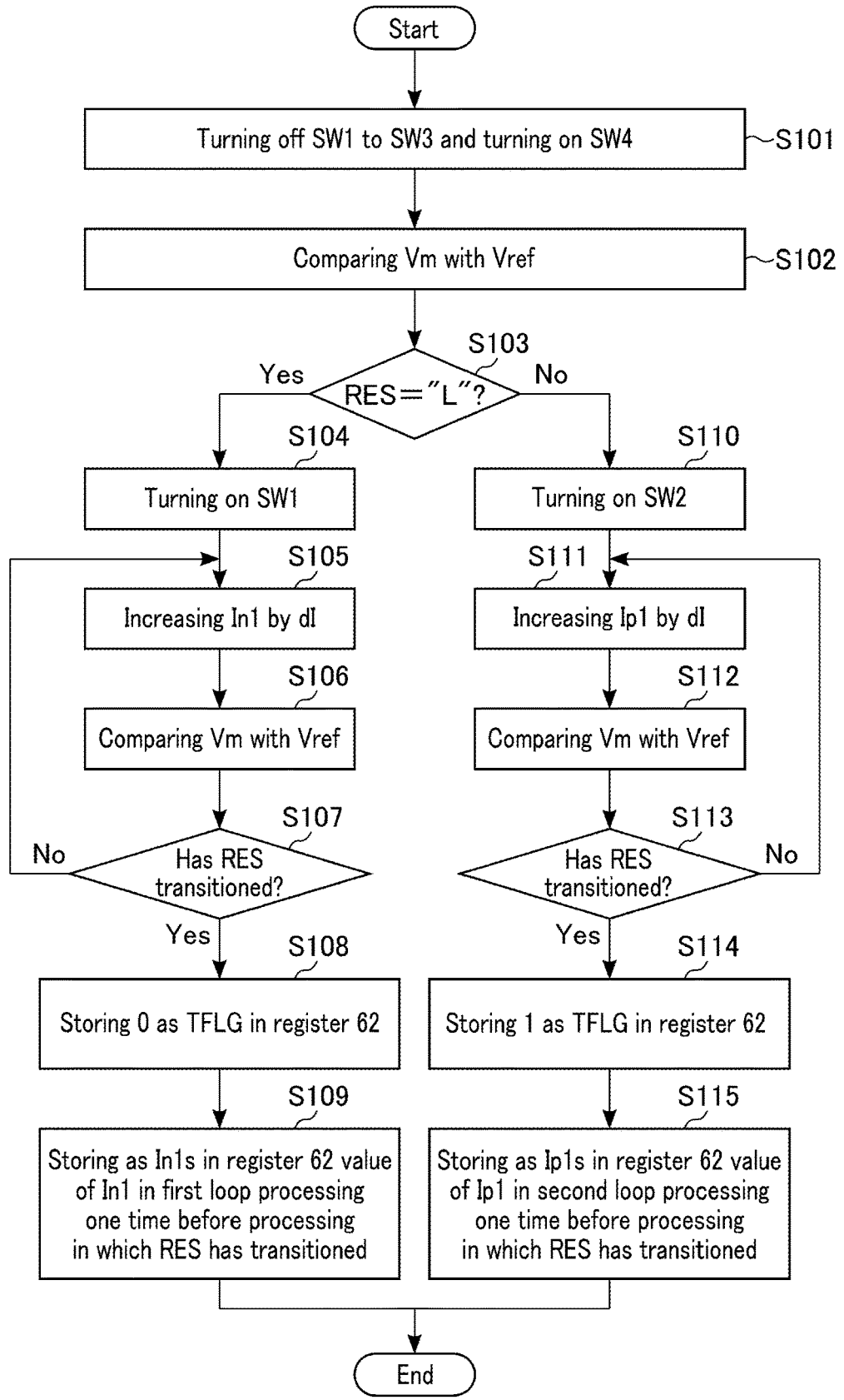
FIG. 9 is a flowchart showing an example of a current adjustment operation of the semiconductor device according to the first embodiment.

FIG. 9 is a flowchart showing an example of a current adjustment operation of the semiconductor device 1.

In the case where the semiconductor device 1 is powered on or externally receives the request signal for requesting execution of the current adjustment operation (adjustment of the monitor current Icm), the control circuit 2 generates a signal at the "L" level as the control signal CS3 and transmits the generated control signal CS3 at the "L" level to the current monitor circuit 4. The control signal CS3 at the "L" level is, for example, a signal for instructing execution of the current adjustment operation.

Upon receipt of the control signal CS3 at the "L" level from the control circuit 2, steps S101 to S115 are executed. Steps S101 to S103 correspond to the determination operation. Steps S104 to S109 correspond to the first adjustment operation. Steps S110 to S115 correspond to the second adjustment operation.

First, the trimming control circuit 61 turns off the switches SW1 to SW3 and turns on the switch SW4 (S101). Next, the comparator CMP compares the voltage Vm of the node ND10 with the reference voltage Vref (S102). Next, the trimming control circuit 61 determines whether or not the comparison result RES in step S102 is at the "L" level (S103).

In the case where the trimming control circuit 61 makes a determination that the comparison result RES is at the "L" level in step S103 (S103 Yes), the trimming control circuit 61 turns on the switch SW1 (S104). Next, the trimming control circuit 61 increases a value of the current In1 of the variable current source 41 by the trimming amount dI (S105). Next, the comparator CMP compares the voltage Vm with the voltage Vref (S106). Next, the trimming control circuit 61 determines whether or not the comparison result RES in step S106 has transitioned from the "L" level to the "H" level (S107).

In the case where the trimming control circuit 61 makes a determination that a logic level of the comparison result RES has not transitioned in step S107 (S107 No), the trimming control circuit 61 executes step S105.

In the case where the trimming control circuit 61 makes a determination that the logic level of the comparison result RES has transitioned in step S107 (S107_Yes), the trimming control circuit 61 stores "0" as an adjustment flag TFLG into the register 62 (S108). Next, the trimming control circuit 61 stores, as a set value In1s of the current In1, a value of the current In1 in the first loop processing one time before the first loop processing in which the comparison result RES has transitioned, into the register 62 (S109).

On the other hand, in the case where the trimming control circuit 61 makes a determination that the comparison result RES is not at the "L" level in step S103 (S103 No), the trimming control circuit 61 turns on the switch SW2 (S110). Next, the trimming control circuit 61 increases a value of the current Ip1 by the trimming amount dI (S111). Next, the comparator CMP compares the voltage Vm with the voltage Vref (S112). Next, the trimming control circuit 61 determines whether or not the comparison result RES in step S112 has transitioned from the "H" level to the "I" level (S113).

In the case where the trimming control circuit 61 makes a determination that a logic level of the comparison result RES has not transitioned in step S113 (S113_No), the trimming control circuit 61 executes step S111.

In the case where the trimming control circuit 61 makes a determination that the logic level of the comparison result RES has transitioned in step S113 (S113 Yes), the trimming control circuit 61 stores "1" as an adjustment flag TFLG into the register 62 (S114). Next, the trimming control circuit 61 stores, as a set value Ip1s of the current Ip1, a value of the current Ip1 in the second loop processing one time before the second loop processing in which the comparison result RES has transitioned, into the register 62 (S115).

1.2.2 Current Monitoring Operation

The current monitoring operation will be described. The current monitoring operation includes a setting operation and a monitoring execution operation. The setting operation is an operation that sets a current value of the variable current source 41 or a current value of the variable current source 42 to a current value adjusted through the current adjustment operation. The monitoring execution operation is an operation that executes monitoring of the monitor current Icm.

(Flowchart)

FIG. 10 is a flowchart showing an example of a current monitoring operation of the semiconductor device 1.

Upon the completion of the current adjustment operation, the control circuit 2 generates a signal at the "H" level as the control signal CS3, and transmits the generated control signal CS3 at the "H" level to the current monitor circuit 4. The control signal CS3 at the "H" level is, for example, a signal for instructing execution of the current monitoring operation.

Upon reception of the control signal CS3 at the "H" level from the control circuit 2, steps S201 to S208 are executed. Steps 201 to 205, 207, and 208 correspond to the setting operation.

First, the trimming control circuit 61 turns off the switches SW1, SW2, and SW4 and turns on the switch SW3 (S201). Next, the trimming control circuit 61 acquires the adjustment flag TFLG, the set value In1s, and the set value Ip1s from the register 62 (S202). Next, the trimming control circuit 61 determines whether or not the adjustment flag TFLG is equal to "0" (S203).

In the case where the adjustment flag TFLG is equal to "0" (S203 Yes), the trimming control circuit 61 sets a value of the current In1 of the variable current source 41 to the set value In1s (S204). Next, the trimming control circuit 61 turns on the switch SW1 (S205). FIG. 11 shows the coupling relationship of the semiconductor device 1 at that time. FIG. 11 is a circuit diagram showing the coupling relationship during the current monitoring operation of the semiconductor device 1 in the case where a value of the current In1 of the variable current source 41 is adjusted to the set value In1s through the current adjustment operation.

Figure 12:
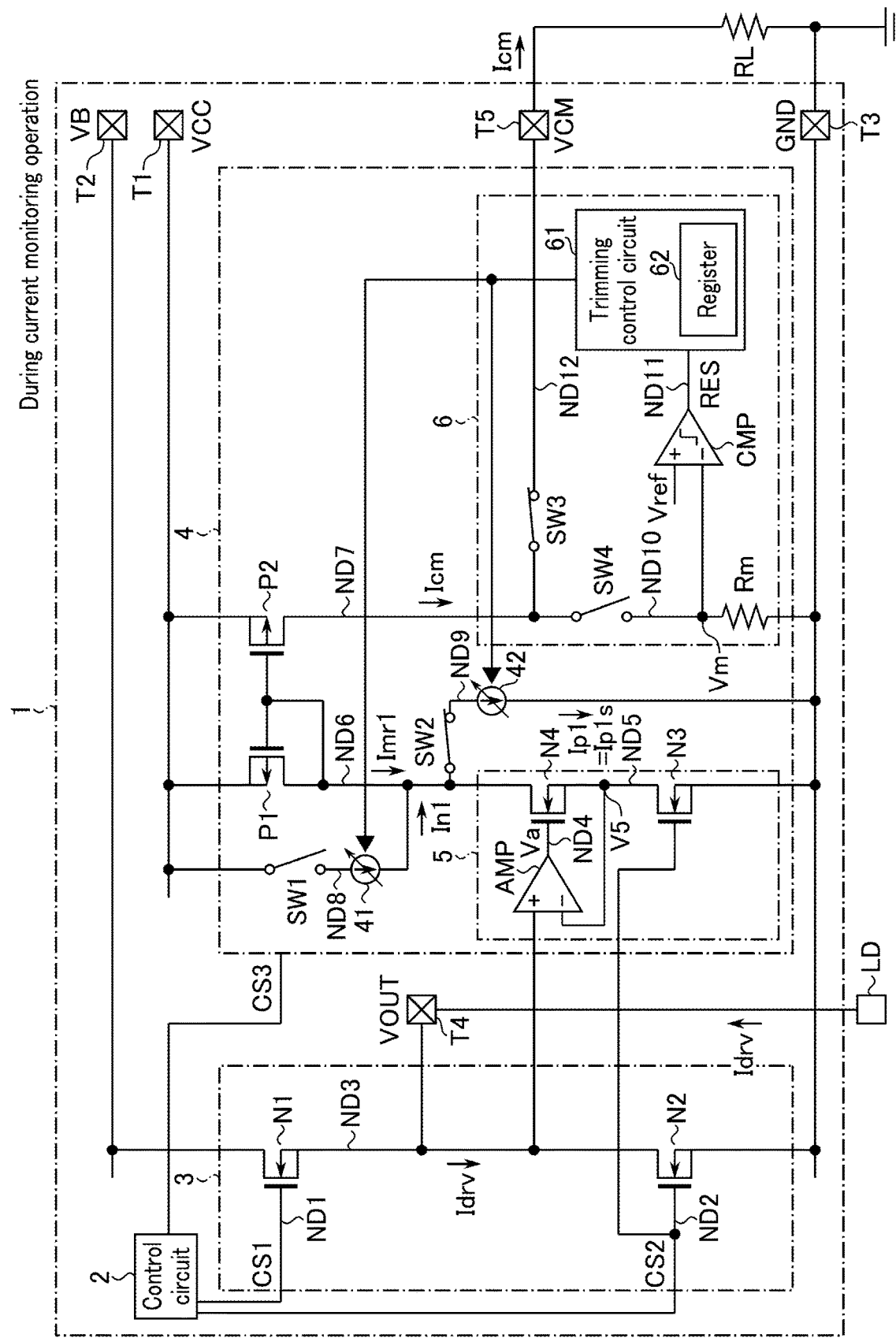
FIG. 12 is a circuit diagram showing a coupling relationship during the current monitoring operation of the semiconductor device according to the first embodiment.

On the other hand, in the case where the adjustment flag TFLG is not equal to "0" (S203_No), the trimming control circuit 61 sets a value of the current Ip1 of the variable current source 42 to the set value Ip1s (S207). Next, the trimming control circuit 61 turns on the switch SW2 (S208). FIG. 12 shows the coupling relationship of the semiconductor device 1 at that time. FIG. 12 is a circuit diagram showing the coupling relationship during the current monitoring operation of the semiconductor device 1 in the case where a value of the current Ip1 of the variable current source 42 is adjusted to the set value Ip1s through the current adjustment operation.

Upon completion of step S205 or step S208, the current monitor circuit 4 initiates the monitoring execution operation (S206). The current monitor circuit 4 is able to monitor the monitor current Icm in a state in which the current In1 is set to the current value In1s adjusted through the current adjustment operation or a state in which the current Ip1 is set to the current value Ip1s adjusted through the current adjustment operation. That is, the current monitor circuit 4 is able to monitor the monitor current Icm with the monitor current Icm being adjusted. This enables the current monitor circuit 4 to detect the monitor current Icm having a value relatively close to 0 in the case where the load is absent.

1.3 Advantageous Effect of Present Embodiment

With a semiconductor device including a driver circuit configured to drive an external load and a current monitor circuit configured to monitor a current flowing into the load, as described above, in the case where the operational amplifier AMP has the input offset voltage and the load is absent, there is a possibility that the measurement accuracy of the monitor current Icm will be deteriorated.

The semiconductor device 1 according to the present embodiment includes the driver circuit 3 and the current monitor circuit 4. The driver circuit 3 drives the load LD by supplying the load current Idrv to the load LD couplable to the input/output terminal T4. The current monitor circuit 4 includes the mirror circuit 5 configured to copy the load current Idrv based on the voltage VOUT of the input/output terminal T4, and output the copied current Imr1, and monitors the monitor current Icm based on the current Imr1. The current monitor circuit 4 also includes the current adjustment circuit 6 configured to adjust the monitor current Icm in the case where the load is absent. By the current adjustment circuit 6 performing the current adjustment operation, the current monitor circuit 4 is able to monitor the monitor current Icm in a state in which the adjustment of the monitor current Icm has been made through the current adjustment operation. The adjustment made by the current adjustment circuit 6 is an adjustment in consideration of the input offset voltage. This enables the current monitor circuit 4 to detect the monitor current Icm having a value relatively close to 0 in the case where the load is absent. Therefore, according to the present embodiment, the current measurement accuracy of the monitor current Icm can be improved.

2. Second Embodiment

A semiconductor device according to a second embodiment will be described. In a semiconductor device 1A according to the second embodiment, a configuration of the current monitor circuit 4 is different from that of the first embodiment. The following description will concentrate on the features different from the first embodiment.

2.1 Circuit Configuration of Semiconductor Device

A circuit configuration of the semiconductor device 1A according to the present embodiment will be described with reference to FIG. 13. FIG. 13 is a circuit diagram showing an example of a configuration of the semiconductor device 1A.

As shown in FIG. 13, the semiconductor device 1A includes the first power supply voltage terminal T1, the second power supply voltage terminal T2, the ground voltage terminal T3, the input/output terminal T4, the current monitor terminal T5, the control circuit 2, the driver circuit 3, and a current monitor circuit 4A. The configurations other than the current monitor circuit 4A are similar to those of FIG. 1 described in the first embodiment. FIG. 13 shows a state in which the load current Idrv flows from the second power supply voltage terminal T2 into the load LD via the NMOS transistor N1 and the input/output terminal T4.

2.2 Configuration of Current Monitor Circuit

A circuit configuration of the current monitor circuit 4A will be described. The semiconductor device 1A according to the present embodiment monitors the load current Idrv at the time when the load LD is driven by the NMOS transistor N1 of the driver circuit 3. That is, the current monitor circuit 4A is a current monitor circuit for a high side driving.

As shown in FIG. 13, the current monitor circuit 4A includes a mirror circuit 5A, the PMOS transistors P1 and P2, the NMOS transistors N6 and N7, the switches SW1 and SW2, the variable current sources 41 and 42, and the current adjustment circuit 6. The configurations other than mirror circuit 5A and the NMOS transistors N6 and N7 are similar to those of FIG. 1 described in the first embodiment.

The mirror circuit 5A includes an NMOS transistor N5, a PMOS transistor P3, and the operational amplifier AMP. The configuration of the operational amplifier AMP is similar to that of FIG. 1 described in the first embodiment.

The NMOS transistor N5 has, for example, a gate width w1 (w1<W1). A gate of the NMOS transistor N5 is coupled to the node ND1. That is, the control signal CS1 is input to the gate of the NMOS transistor N5. One end of the NMOS transistor N5 is coupled to a node ND21. The other end of the NMOS transistor N5 is coupled to the second power supply voltage terminal T2.

The first input terminal of the operational amplifier AMP is coupled to the node ND3. That is, the voltage VOUT of the input/output terminal T4 is applied to the first input terminal of the operational amplifier AMP. The second input terminal of the operational amplifier AMP is coupled to the node ND21. That is, a voltage V21 of the node ND21 is applied to the second input terminal of the operational amplifier AMP. The operational amplifier AMP outputs voltage Va from its output terminal based on the voltage VOUT and the voltage V21. The output terminal of the operational amplifier AMP is coupled to the node ND4.

A gate of the PMOS transistor P3 is coupled to the node ND4. That is, the voltage Va is applied to the gate of the PMOS transistor P3. One end of the PMOS transistor P3 is coupled to a node ND22. The other end of the PMOS transistor P3 is coupled to the node ND21.

A gate of the NMOS transistor N6 is coupled to the node ND22. One end of the NMOS transistor N6 is coupled to the node ND22. The other end of the NMOS transistor N6 is coupled to the ground voltage terminal T3.

A gate of the NMOS transistor N7 is coupled to the node ND22. One end of the NMOS transistor N7 is coupled to the node ND6. The other end of the NMOS transistor N7 is coupled to the ground voltage terminal T3.

The switch SW1 is an element configured to switch coupling and uncoupling between the node ND22 and the variable current source 41. One end of the switch SW1 is coupled to the node ND22. The other end of the switch SW1 is coupled to a node ND23.

The switch SW2 is an element configured to switch coupling and uncoupling between the node ND6 and the variable current source 42. One end of the switch SW2 is coupled to the node ND6. The other end of the switch SW2 is coupled to a node ND24.

The variable current source 41 supplies the current In1 from the node ND22 to the ground voltage terminal T3. One end of the variable current source 41 is coupled to the node ND23. The other end of the variable current source 41 is coupled to the ground voltage terminal T3.

The variable current source 42 supplies the current Ip1 from the node ND6 to the ground voltage terminal T3. One end of the variable current source 42 is coupled to the node ND24. The other end of the variable current source 42 is coupled to the ground voltage terminal T3.

The operational amplifier AMP and the PMOS transistor P3 cause the operational amplifier AMP to output the voltage Va in such a manner that the voltage VOUT will be equal to the voltage V21. That is, the voltage V21 is controlled so as to be equal to the voltage VOUT. Accordingly, in the case where the load LD is driven by the NMOS transistor N1 and the load current Idrv flows into the load LD, the copy current Imr1=Idrv×(w1/W1) flows from the second power supply voltage terminal T2 into the ground voltage terminal T3 via the NMOS transistor N5, the PMOS transistor P3, and the NMOS transistor N6. Since the NMOS transistor N6 and the NMOS transistor N7 configure a current mirror, a current equal in magnitude to current Imr1 flows from the first power supply voltage terminal T1 into the ground voltage terminal T3, too, via the PMOS transistor P1 and the NMOS transistor N7. Hereinafter, this current will be referred to as a "copy current Imr1'". Furthermore, since the PMOS transistor P1 and the PMOS transistor P2 configure a current mirror, the monitor current Icm equal in magnitude to the current Imr1 flows from the first power supply voltage terminal T1 into the node ND7, too, via PMOS transistor P2.

2.3 Operation

The load drive operation, the current monitoring operation, and the current adjustment operation of the semiconductor device 1A are similar to those of the first embodiment. Hereinafter, the first adjustment operation and the second adjustment operation will be described.

(First Adjustment Operation)

FIG. 14 is a circuit diagram showing a coupling relationship during the first adjustment operation of the semiconductor device 1A. Hereinafter, a current flowing into the node ND21 will be referred to as a "current Ind21". A current flowing into the node ND22 will be referred to as a "current Ind22". A current flowing into the node ND6 will be referred to as a "current Ind6".

With reference to FIG. 14, the following will describe a case where a deviation of the monitor current Icm (shift toward the plus side with respect to 0) is 6×dI as in the example shown in FIG. 6 described in the first embodiment.

As shown in FIG. 14, in the case of the current In1=0, the current In1 does not flow into the node ND23. The current Ind21=Imr1=6×dI flows into the node ND21. The current Ind22=Ind21−In1=6×dI flows into the node ND22. Accordingly, the current Imr1'=Ind22=6×dI flows into the node ND6, and the monitor current Icm=Ind6=6×dI flows into the node ND10.

In the case of the current In1=dI, the current In1=dI flows into the node ND23. The current Ind21=6×dI flows into the node ND21. The current Ind22=5×dI flows into the node ND22. Accordingly, the current Imr1'=5×dI flows into the node ND6, and the monitor current Icm=5×dI flows into the node ND10.

In the case of the current In1=2×dI, the current In1=2×dI flows into the node ND23. The current Ind21=6×dI flows into the node ND21. The current Ind22=4×dI flows into the node ND22. Accordingly, the current Imr1'=4×dI flows into the node ND6, and the monitor current Icm=4×dI flows into the node ND10.

In the case of the current In1=3×dI, the current In1=3×dI flows into the node ND23. The current Ind21=6×dI flows into the node ND21. The current Ind22=3×dI flows into the node ND22. Accordingly, the current Imr1'=3×dI flows into the node ND6, and the monitor current Icm=3×dI flows into the node ND10.

In the case of the current In1=4×dI, the current In1=4×dI flows into the node ND23. The current Ind21=6×dI flows into the node ND21. The current Ind22=2×dI flows into the node ND22. Accordingly, the current Imr1'=2×dI flows into the node ND6, and the monitor current Icm=2×dI flows into the node ND10.

In the case of the current In1=5×dI, the current In1=5×dI flows into the node ND23. The current Ind21=6×dI flows into the node ND21. The current Ind22=dI flows into the node ND22. Accordingly, the current Imr1'=dI flows into the node ND6, and the monitor current Icm=dI flows into the node ND10.

In the case of the current In1=6×dI, the current In1=6×dI flows into the node ND23. The current Ind21=6×dI flows into the node ND21. The current Ind22 does not flow into the node ND22 (Ind22=0). Accordingly, the current Imr1' does not flow into the node ND6 (Imr1'=0), and the monitor current Icm does not flow into the node ND10 (Icm=0).

Accordingly, the trimming control circuit 61 selects 6×dI as a value of the current In1. By performing the first adjustment operation in this manner, the monitor current Icm is adjusted to approach 0.

(Second Adjustment Operation)

FIG. 15 is a circuit diagram showing a coupling relationship during the second adjustment operation of the semiconductor device 1A.

As shown in FIG. 15, a copy current Imr1' equal in magnitude to the copy current Imr1 flows into the node ND6. Accordingly, as in the first embodiment, the monitor current Icm is adjusted to approach 0 by adjusting a value of the current Ip1 of the variable connect source 42 coupled to the node ND6. Therefore, as in the example shown in FIG. 8 described in the first embodiment, in the case where a deviation of the monitor current Icm (shift toward the minus side with respect to 0) is 6×dI, by performing the second adjustment operation, the monitor current Icm is adjusted to approach 0, as in the first embodiment.

2.4 Advantageous Effect of Present Embodiment

The present embodiment produces advantageous effects similar to those of the first embodiment.

3. Third Embodiment

A semiconductor device according to a third embodiment will be described. A semiconductor device 1B according to the third embodiment is different from the first embodiment in terms of including a current detection circuit and eliminating the ground voltage terminal T3 and the current monitor terminal T5. The following description will concentrate on the features different from the first embodiment.

3.1 Circuit Configuration of Semiconductor Device

A circuit configuration of the semiconductor device 1B according to the present embodiment will be described with reference to FIG. 16. FIG. 16 is a circuit diagram showing an example of a configuration of the semiconductor device 1B.

As shown in FIG. 16, the semiconductor device 1B includes the first power supply voltage terminal T1, the second power supply voltage terminal T2, the input/output terminal T4, the control circuit 2, the driver circuit 3, the current monitor circuit 4, and a current detection circuit 7. The configurations other than the current detection circuit 7 are similar to those of FIG. 1 described in the first embodiment. FIG. 16 shows a state in which during the current monitoring operation, the switches SW1 and SW3 are turned on and the switches SW2 and SW4 are turned off.

The current detection circuit 7 is a circuit configured to detect the monitor current Icm. The current detection circuit 7 is coupled to the node ND12. One end of the resistance element RL is coupled to the node ND12.

The load drive operation, the current monitoring operation, and the current adjustment operation of the semiconductor device 1B are similar to those of the first embodiment. The current detection circuit 7 can detect monitor current Icm by detecting a voltage of the node ND12.

3.2 Advantageous Effect of Present Embodiment

The present embodiment produces advantageous effects similar to those of the first embodiment. As a matter of course, the present embodiment is applicable to the semiconductor device 1A according to the second embodiment.

3.3 Modification

A semiconductor device according to a modification of the third embodiment will be described. A semiconductor device 1C according to the modification of the third embodiment is different from the third embodiment in that the current detection circuit 7 is replaced with an A/D converter 8. The following description will concentrate on the features different from the third embodiment.

3.3.1 Circuit Configuration of Semiconductor Device

Figure 17:
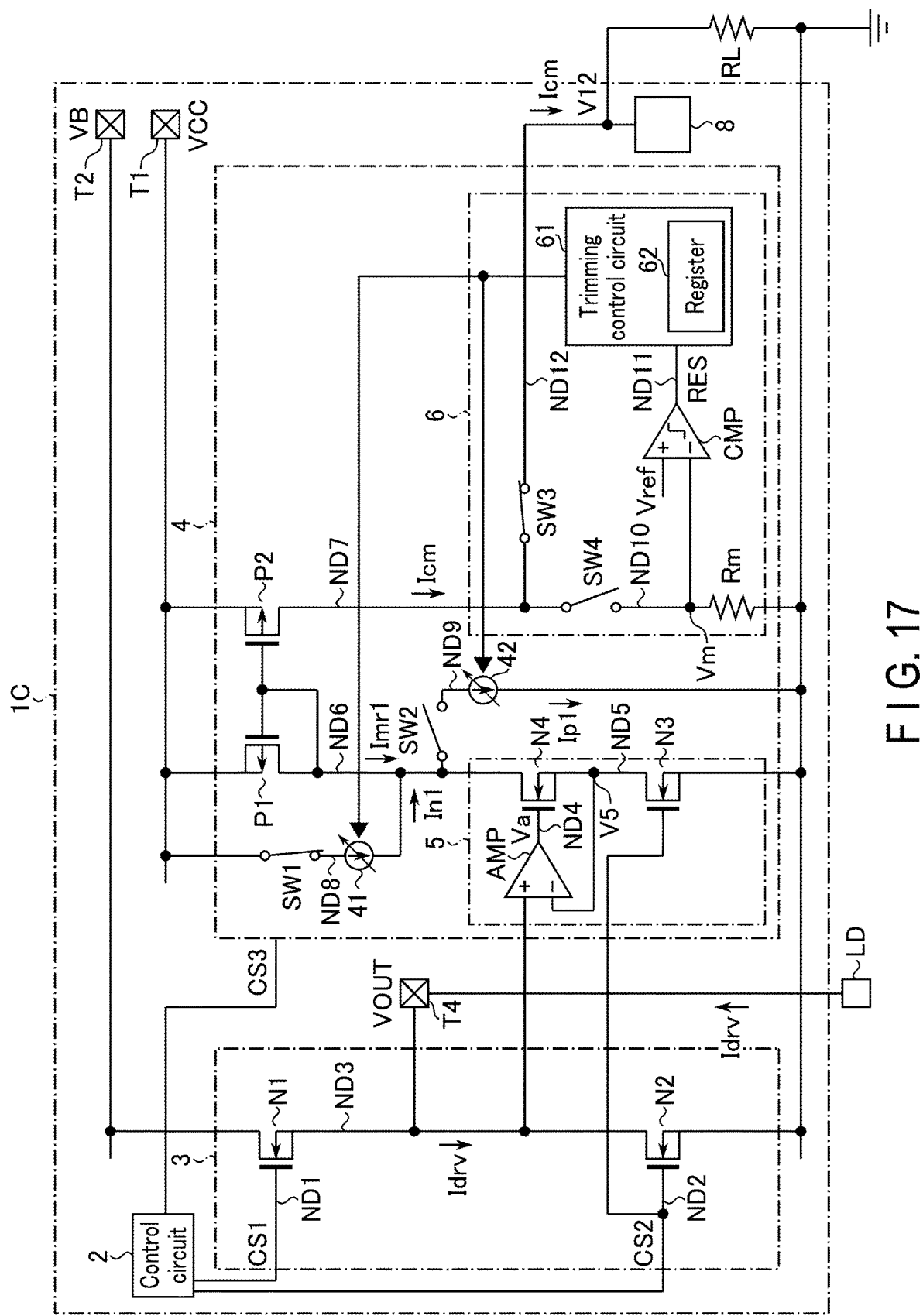
FIG. 17 is a circuit diagram showing an example of a configuration of a semiconductor device according to a modification of the third embodiment.

A circuit configuration of the semiconductor device 1C according to the present modification will be described with reference to FIG. 17. FIG. 17 is a circuit diagram showing an example of a configuration of the semiconductor device 1C.

As shown in FIG. 17, the semiconductor device 1C includes the first power supply voltage terminal T1, the second power supply voltage terminal T2, the input/output terminal T4, the control circuit 2, the driver circuit 3, the current monitor circuit 4, and the A/D converter 8. The configurations other than the A/D converter 8 are similar to those of FIG. 16 described in the third embodiment. FIG. 17 shows a state in which during the current monitoring operation, the switches SW1 and SW3 are turned on, and the switches SW2 and SW4 are turned off.

The A/D converter 8 is a circuit configured to convert a voltage V12 (analog value) of the node ND12 into a digital value (hereinafter, referred to as a "voltage V12'"). The A/D converter 8 is coupled to the node ND12. One end of the resistance element RL is coupled to the node ND12.

The load drive operation, the current monitoring operation, and the current adjustment operation of the semiconductor device 1C are similar to those of the first embodiment. Since the voltage V12 is converted into the voltage V12' by the A/D converter 8, the monitor current Icm can be detected by detecting the converted voltage V12'.

3.3.2 Advantageous Effects of Present Modification

The present modification produces advantageous effects similar to those of the first arrangement. As a matter of course, the present modification is applicable to the semiconductor device 1A according to the second embodiment.

4. Modification, Etc.

As described above, a semiconductor device (1) according to an embodiment includes: a first circuit (3) configured to drive a load (LD) couplable to a first terminal (T4) by supplying a load current (Idrv) to the load; and a third circuit (4) including a second circuit (5) configured to copy the load current (Idrv) based on a first voltage (VOUT) of the first terminal (T4) and output a first current (Imr1) obtained by copying the load current, the third circuit being configured to monitor a second current (Icm) based on the first current. The third circuit (4) further includes a fourth circuit (6) configured to adjust the second current (Icm) in a case where the load current (Idrv) is not supplied to the load (LD).

The embodiments are not limited to those described in the above, and various modifications can be made.

Furthermore, the order of the steps in the flowchart described in the above embodiments may be altered to the extent possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
    a first circuit configured to drive a load couplable to a first terminal by supplying a load current to the load; and
    a third circuit including a second circuit configured to copy the load current based on a first voltage of the first terminal and output a first current obtained by copying the load current, the third circuit being configured to monitor a second current based on the first current,
    wherein the third circuit further includes a fourth circuit configured to adjust the second current in a case where the load current is not supplied to the load.

2. The device according to claim 1, wherein the fourth circuit makes a comparison between a second voltage obtained by converting the second current into a voltage and a reference voltage, and based on a result of the comparison, makes an adjustment in such a manner that the second current approaches 0.

3. The device according to claim 1, wherein in a case where the semiconductor device is powered on, the fourth circuit adjusts the second current.

4. The device according to claim 1, wherein in a case where the semiconductor device externally receives a signal for requesting execution of an adjustment of the second current, the fourth circuit adjusts the second current.

5. The device according to claim 1, wherein the third circuit monitors the second current in a state in which the second current has been adjusted.

6. The device according to claim 1, wherein
the second circuit includes:
- a first transistor, a control signal being input to a gate of the first transistor, one end of the first transistor being coupled to a first node, another end of the first transistor being coupled to a second terminal;
- an operational amplifier, the first voltage being applied to a first input terminal of the operational amplifier, a third voltage of the first node being applied to a second input terminal of the operational amplifier, the operational amplifier being configured to output a fourth voltage from an output terminal based on the first voltage and the third voltage; and
- a second transistor, the fourth voltage being applied to a gate of the second transistor, one end of the second transistor being coupled to a second node, another end of the second transistor being coupled to the first node, the third circuit further includes:
- a third transistor, a gate of the third transistor being coupled to the second node, one end of the third transistor being coupled to a third terminal, another end of the third transistor being coupled to the second node;
- a fourth transistor, a gate of the fourth transistor being coupled to the second node, one end of the fourth transistor being coupled to the third terminal, another end of the fourth transistor being coupled to a third node;
- a first switch, one end of the first switch being coupled to the third terminal, another end of the first switch being coupled to a fourth node;
- a second switch, one end of the second switch being coupled to the second node, another end of the second switch being coupled to a fifth node;
- a first variable current source, one end of the first variable current source being coupled to the fourth node, another end of the first variable current source being coupled to the second node; and
- a second variable current source, one end of the second variable current source being coupled to the fifth node, another end of the second variable current source being coupled to the second terminal, and the fourth circuit includes:
- a third switch, one end of the third switch being coupled to the third node, another end of the third switch being coupled to a sixth node;
- a fourth switch, one end of the fourth switch being coupled to the third node, another end of the fourth switch being coupled to a seventh node;
- a resistance element, one end of the resistance element being coupled to the seventh node, another end of the resistance element being coupled to the second terminal;
- a comparator configured to make a comparison between a fifth voltage of the seventh node and a reference voltage, and output a result of the comparison; and
- a control circuit configured to make an adjustment based on the result in such a manner that the second current approaches 0.

7. The device according to claim 6, wherein
in a case where the fifth voltage is equal to or greater than the reference voltage, the control circuit turns on the first switch, turns off the second switch and increases a current of the first variable current source, and in a case where the fifth voltage is smaller than the reference voltage, the control circuit turns off the first switch, turns on the second switch and increases a current of the second variable current source.

8. The device according to claim 6, wherein
in a case where the fifth voltage is equal to or greater than the reference voltage, the control circuit repeatedly executes first loop processing including processing of turning on the first switch, turning off the second switch and increasing a current of the first variable current source by a first trimming amount, and processing of determining whether or not a logic level of the result has transitioned, and adjusts a value of the current of the first variable current source to a first current value in the first loop processing one time before the first loop processing in which the logic level of the result has transitioned, and in a case where the fifth voltage is smaller than the reference voltage, the control circuit repeatedly executes second loop processing including processing of turning off the first switch, turning on the second switch and increasing a current of the second variable current source by a second trimming amount, and processing of determining whether or not the logic level of the result has transitioned, and adjusts a value of the current of the second variable current source to a second current value in the second loop processing one time before the second loop processing in which the logic level of the result has transitioned.

9. The device according to claim 1, wherein the fourth circuit includes a register configured to store a result of an adjustment by the fourth circuit.

10. The device according to claim 1, wherein
the second circuit includes:
- a fifth transistor, a control signal being input to a gate of the fifth transistor, one end of the fifth transistor being coupled to an eighth node, another end of the fifth transistor being coupled to a fourth terminal;
- an operational amplifier, the first voltage being applied to a first input terminal of the operational amplifier, a sixth voltage of the eighth node being applied to a second input terminal of the operational amplifier, the operational amplifier being configured to output a seventh voltage from an output terminal based on the first voltage and the sixth voltage; and
- a sixth transistor, the seventh voltage being applied to a gate of the sixth transistor, one end of the sixth transistor being coupled to a ninth node, another end of the sixth transistor being coupled to the eighth node, the third circuit further includes:
- a seventh transistor, a gate of the seventh transistor being coupled to the ninth node, one end of the seventh transistor being coupled to the ninth node, another end of the seventh transistor being coupled to a fifth terminal;

an eighth transistor, a gate of the eighth transistor being coupled to the ninth node, one end of the eighth transistor being coupled to a tenth node, another end of the eighth transistor being coupled to the fifth terminal;

a ninth transistor, a gate of the ninth transistor being coupled to the tenth node, one end of the ninth transistor being coupled to a sixth terminal, another end of the ninth transistor being coupled to the tenth node;

a tenth transistor, a gate of the tenth transistor being coupled to the tenth node, one end of the tenth transistor being coupled to the sixth terminal, another end of the tenth transistor being coupled to an eleventh node;

a fifth switch, one end of the fifth switch being coupled to the ninth node, another end of the fifth switch being coupled to a twelfth node;

a sixth switch, one end of the sixth switch being coupled to the tenth node, another end of the sixth switch being coupled to a thirteenth node;

a third variable current source, one end of the third variable current source being coupled to the twelfth node, another end of the third variable current source being coupled to the fifth terminal; and a fourth variable current source, one end of the fourth variable current source being coupled to the thirteenth node, another end of the fourth variable current source being coupled to the fifth terminal, and the fourth circuit includes:

a seventh switch, one end of the seventh switch being coupled to the eleventh node, another end of the seventh switch being coupled to a fourteenth node;

an eighth switch, one end of the eighth switch being coupled to the eleventh node, another end of the eighth switch being coupled to a fifteenth node;

a resistance element, one end of the resistance element being coupled to the fifteenth node, another end of the resistance element being coupled to the fifth terminal;

a comparator configured to make a comparison between an eighth voltage of the fifteenth node and a reference voltage, and output a result of the comparison; and a control circuit configured to make an adjustment based on the result in such a manner that the second current approaches 0.

11. The device according to claim 10, wherein in a case where the eighth voltage is equal to or greater than the reference voltage, the control circuit turns on the fifth switch, turns off the sixth switch and increases a current of the third variable current source, and in a case where the eighth voltage is smaller than the reference voltage, the control circuit turns off the fifth switch, turns on the sixth switch and increases a current of the fourth variable current source.

12. The device according to claim 10, wherein in a case where the eighth voltage is equal to or greater than the reference voltage, the control circuit repeatedly executes first loop processing including processing of turning on the fifth switch, turning off the sixth switch and increasing a current of the third variable current source by a third trimming amount, and processing of determining whether or not a logic level of the result has transitioned, and adjusts a value of the current of the third variable current source to a third current value in the first loop processing one time before the first loop processing in which the logic level of the result has transitioned, and in a case where the eighth voltage is smaller than the reference voltage, the control circuit repeatedly executes second loop processing including processing of turning off the fifth switch, turning on the sixth switch and increasing a current of the fourth variable current source by a fourth trimming amount, and processing of determining whether or not the logic level of the result has transitioned, and adjusts a value of the current of the fourth variable current source to a fourth current value in the second loop processing one time before the second loop processing in which the logic level of the result has transitioned.

13. The device according to claim 1, further comprising a fifth circuit configured to control operation of the first circuit and the third circuit, wherein the fifth circuit generates a first control signal and a second control signal that each control the first circuit, and a third control signal for controlling the third circuit.

14. The device according to claim 1, further comprising a current detection circuit configured to detect the second current.

15. The device according to claim 1, further comprising an A/D converter configured to convert a voltage of a node into a digital value, the second current flowing into the node.

* * * * *